(12) United States Patent
Kanno et al.

(10) Patent No.: US 8,013,656 B2
(45) Date of Patent: Sep. 6, 2011

(54) SEMICONDUTOR INTEGRATED CIRCUIT DEVICE

(75) Inventors: Yusuko Kanno, Kodaira (JP); Kazuo Tanaka, Hachioji (JP); Shunsuke Toyoshima, Higashimurayama (JP); Takeo Toba, Higashimurayama (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/944,898

(22) Filed: Nov. 12, 2010

(65) Prior Publication Data

US 2011/0057708 A1  Mar. 10, 2011

Related U.S. Application Data

(62) Division of application No. 12/422,712, filed on Apr. 13, 2009, now Pat. No. 7,855,590, which is a division of application No. 11/405,541, filed on Apr. 18, 2006, now Pat. No. 7,532,054.

(30) Foreign Application Priority Data

Apr. 19, 2005  (JP) ................................. 2005-120605

(51) Int. Cl.
*H03L 5/00*  (2006.01)
(52) U.S. Cl. .......................................... 327/333; 326/80
(58) Field of Classification Search .................. 327/333; 326/80, 81; 365/189.11
See application file for complete search history.

(56) References Cited

U.S. PATENT DOCUMENTS

| | | | |
|---|---|---|---|
| 5,969,542 A | 10/1999 | Maley et al. | |
| 6,346,829 B1 | 2/2002 | Coddington | |
| 6,512,407 B2 * | 1/2003 | Horan et al. | 327/333 |
| 6,556,061 B1 | 4/2003 | Chen et al. | |
| 6,841,920 B2 | 1/2005 | Takamura et al. | |
| 6,844,769 B2 | 1/2005 | Yamamoto et al. | |
| 6,882,224 B1 | 4/2005 | Gaboury et al. | |
| 7,151,400 B2 | 12/2006 | Chen | |
| 7,205,820 B1 | 4/2007 | Yeung et al. | |
| 7,532,054 B2 * | 5/2009 | Kanno et al. | 327/333 |
| 7,855,590 B2 * | 12/2010 | Kanno et al. | 327/333 |
| 2003/0155958 A1 | 8/2003 | Yamamoto et al. | |
| 2005/0134355 A1 | 6/2005 | Maede et al. | |
| 2007/0247210 A1 | 10/2007 | Maede et al. | |

FOREIGN PATENT DOCUMENTS

| | | |
|---|---|---|
| JP | 2002-094364 A | 3/2002 |
| JP | 2003-152096 | 5/2003 |
| JP | 2005-027160 A | 1/2005 |

* cited by examiner

*Primary Examiner* — Long Nguyen
(74) *Attorney, Agent, or Firm* — Miles & Stockbridge P.C.

(57) ABSTRACT

A semiconductor integrated circuit device including an I/O circuitry capable of low-voltage high-speed operation at low cost is provided. In the I/O circuitry, when an I/O voltage (for example, 3.3 V) is lowered to a predetermined voltage (for example, 1.8 V), portions causing a speed deterioration are a level conversion unit and a pre-buffer unit for driving a main large-sized buffer. In view of this, a high voltage is applied to a level up converter and a pre-buffer circuit. By doing so, it is possible to achieve an I/O circuitry capable of low-voltage high-speed operation at low cost.

4 Claims, 18 Drawing Sheets

FIG. 4

SEMICONDUTOR INTEGRATED CIRCUIT DEVICE

CROSS-REFERENCE TO RELATED APPLICATION

This application is a division of application Ser. No. 12/422,712 filed Apr. 13, 2009 now U.S. Pat. No. 7,855,590, which is a division of application Ser. No. 11/405,541 filed Apr. 18, 2006 (now U.S. Pat. No. 7,532,054). The present application also claims priority from Japanese Patent Application No. JP 2005-120605 filed on Apr. 19, 2005, the content of which is hereby incorporated by reference into this application.

TECHNICAL FIELD OF THE INVENTION

The present invention relates to a semiconductor integrated circuit device. More particularly, it relates to a technology effectively applied to a semiconductor integrated circuit device such as a system LSI or a microprocessor for mobile devices.

BACKGROUND OF THE INVENTION

The inventors of the present invention have studied the following technologies regarding a semiconductor integrated circuit device such as a system LSI or a microprocessor for mobile devices.

In recent mobile devices, I/O (input/output) voltages have been more and more diversified in order to achieve the reduction in voltage for lower power consumption and also to use the conventional interface that operates at a high voltage for effectively utilizing the existing resources. With respect to the voltage reduction, in particular, demands for the lower power consumption have been strong in an interface unit of a dynamic random access memory (DRAM), which is a general-purpose storage element. Such demands serve as an engine of standardization of low-voltage I/O. For example, in mobile devices, the voltage of 1.8 V which is lower in comparison with the current industry standard of 3.3 V has been becoming the standard interface voltage for SDRAM, DDR-SDRAM, and others.

On the other hand, it is also important to keep the conventional interface. This is because a removable non-volatile memory (such as flash memory) is designed to operate at a high voltage (3.3 V), and its interface specifications are also standardized in the industry. Such a conventional interface has been adopted to various types of devices of different product generations, and has an advantage of cost reduction by a mass-production effect. Therefore, demands for the continued use of such a conventional I/O are also high.

Therefore, at present, in consideration of cost and power reduction, it is extremely difficult to unify all power supply voltages for I/O circuitries (input/output circuitry) incorporated in an LSI (for example, to unify all power supply voltages into a voltage of 1.8 V).

Meanwhile, for low-voltage (1.8 V) I/O, a high-speed operation has not been much demanded so far. Thus, for 1.8 V I/O, a transistor supposed to be operated at a standard voltage (for example, 3.3 V) can be used as being operated at a low voltage (1.8 V). However, recent mobile devices are better equipped with a variety of applications, and needs for transferring a large amount of data at high speed have been increasing. Therefore, demands for a high-speed operation have been increasing even in I/O of a low-voltage operation. In the future, speeding up of 1.8 V I/O will be imperative.

SUMMARY OF THE INVENTION

Meanwhile, as a result of the study by the inventors of the present invention for the technologies as described above, the following has been revealed.

SoC (System-on-a-Chip) LSIs which are currently in the mainstream are supposed to be operated at a core voltage (for example, 1.2 V), which is a supply voltage for transistors forming a logic circuit such as a CPU, and at an I/O voltage (for example, 3.3 V) for matching with external devices. Thus, two types of thickness are designed for the gate insulating film of the MISFET. When 1.8 V I/O is designed under a boundary condition in such a design as described above, a MISFET for 3.3 V is used for the 1.8 V operation. In this case, as is evident from a so-called current-voltage relationship of the MISFET in which a saturation current Ids of the MISFET is proportional to the square of a difference between a gate voltage Vg and a threshold voltage Vth ($Ids \propto (Vg-Vth)^2$), a saturation current in the 3.3 V operation is approximately six times larger than a saturation current in the 1.8 V operation, where it is assumed that Vth=0.7 V. In terms of a delay time (Tpd), the delay time is a quotient obtained by dividing a product of a power supply voltage V and a gate capacitance C by Ids ($Tpd \approx C \times V/Ids$). Therefore, the operation is slowed about three times. For this reason, a high-speed operation at 1.8 V is difficult to achieve by using a transistor for 3.3 V.

In order to increase the speed of the 1.8 V operation, the design in which a MISFET for 3.3 V is formed by using a MISFET with a low threshold value obtained by adding an implantation process may be possible. However, if MISFETs with a low threshold value are used for the entire low-power I/O circuitry extending from a level conversion circuit to a pre-buffer and a main buffer, the amount of leakage current is increased, and the low-power characteristic which is imperative for mobile devices is lost.

Alternatively, the design in which I/O operating at 1.8 V is formed by using a MISFET for a logic circuit operating at 1.2 V may be possible. An example thereof is disclosed in U.S. Pat. No. 5,969,542 (Patent Document 1). This patent document 1 discloses that 2.5 V I/O is formed by using a 1.8 V device, in which a withstand voltage mitigation technology for mitigating a maximum applied voltage to the MISFET is used. However, if I/O circuitry for 1.8 V is formed by the use of a MISFET for 1.2 V by applying the technology described above, the threshold value of the MISFET for 1.2 V has to be set low due to a so-called scaling law. Therefore, a problem of an increase in leakage current occurs. Furthermore, since a measure for electrostatic damage (ESD measure) has to be newly implemented, an additional number of processes and cost increase are inevitable.

The above-described examples have a small impact on the LSI manufacturing process and the number of masks. However, if no consideration is required at all for these factors, it is possible to take a method of using a plurality of MISFETs having different gate insulating film thicknesses. When a MISFET designed to have a gate insulating film thickness that can obtain a large current at 1.8 V is used, since the ON current of the MISFET is proportional to the inverse of the gate insulating film, if such a special MISFET can be added, speeding-up can be achieved. In this case, a leakage current does not pose any problem. However, since three types of gate insulating film thicknesses have to be provided, it is unavoidable to increase complexity of the manufacturing process, the number of masks, and the number of processes for quality control. Consequently, the manufacturing cost is increased.

Consumer products including mobile devices are cost-conscious products to win the competition with other companies. Therefore, it is desired to narrow down the types of devices for manufacturing a SoC LSI, reduce the number of masks to be used, and simplify the process steps. Thus, as the I/O circuitry for mobile devices, it is necessary to design the 1.8-V high-speed I/O by using transistors for 3.3 V at low cost.

Therefore, an object of the present invention is to provide a semiconductor integrated circuit device with an I/O circuitry capable of low-voltage high-speed operation at low cost.

The above and other objects and novel characteristics of the present invention will be apparent from the description of this specification and the accompanying drawings.

The typical ones of the inventions disclosed in this application will be briefly described as follows.

In the present invention, in view of the fact that it is a level conversion unit and a pre-buffer unit for driving a main large-size buffer that cause a speed degradation when an I/O voltage vcc is lowered in an I/O circuitry, a high voltage is applied to these units. By doing so, it is possible to achieve the low-voltage high-speed operation I/O at low cost.

More specifically, a semiconductor integrated circuit device according to the present invention comprises: a circuit operating at a first power supply voltage; and an output circuit operating at a second power supply voltage higher than the first power supply voltage, wherein the semiconductor integrated circuit device further comprises: means which once amplifies a signal voltage amplitude to a third power supply voltage higher than the second power supply voltage, and then performs conversion to a signal having an amplitude of the second power supply voltage at the time of signal transmission from the circuit operating at the first power supply voltage to the output circuit operating at the second power supply voltage.

The effects obtained by typical aspects of the present invention will be briefly described below.

That is, in a semiconductor integrated circuit device with an I/O circuitry, low-voltage high-speed operation can be achieved at low cost.

BRIEF DESCRIPTIONS OF THE DRAWINGS

FIG. 4 is a drawing showing structure examples of transistors (MISFETs) for use in the semiconductor integrated circuit device according to one embodiment of the present embodiment;

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
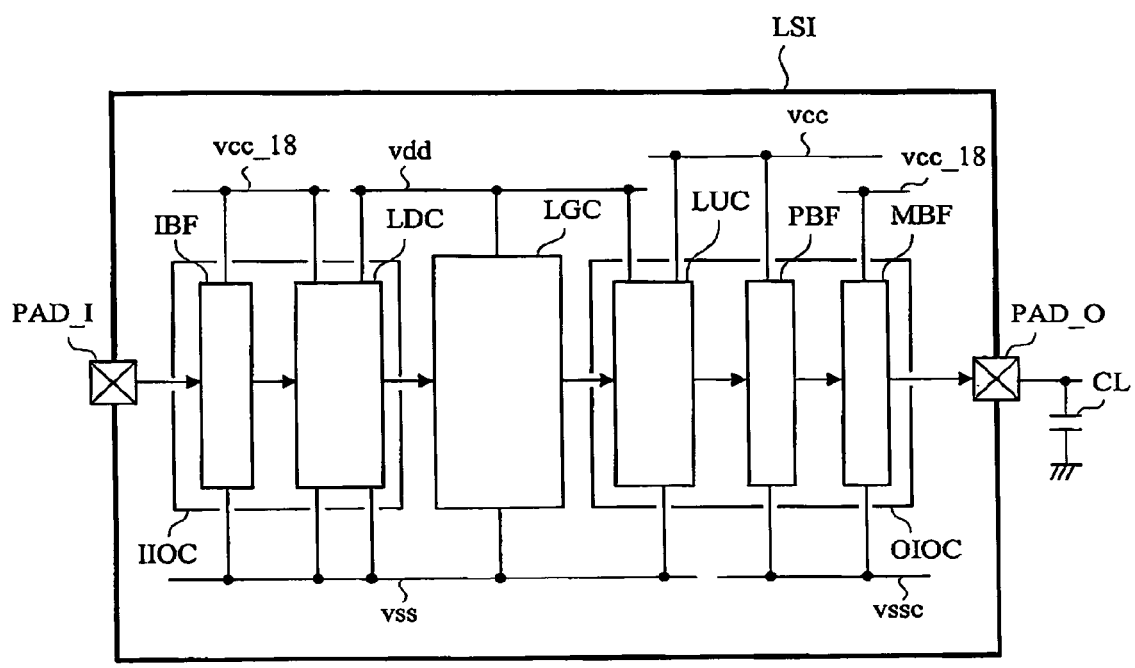
FIG. 1 is a block diagram showing a main structure of a semiconductor integrated circuit device according to one embodiment of the present invention.

FIG. 1 is a drawing of a main structure of a semiconductor integrated circuit device according to one embodiment of the present invention. The feature of the present embodiment lies in that, in an output buffer for sending a signal from a logic circuit in an LSI (semiconductor integrated circuit device) to the outside thereof, the signal is first converted to a signal with a voltage amplitude higher than that of a power supply voltage for use in an interface unit, and is then converted to a power supply voltage amplitude for the interface.

FIG. 1 depicts an LSI supplied with a power supply voltage vdd (for example, at 1.2 V, which is referred to as a first power supply voltage) for use in a logic circuit (logic unit) LGC such as a CPU in the LSI, a power supply voltage vcc (for example, at 3.3 V, which is referred to as a third power supply voltage) for standard interface, and a power supply voltage vcc_18 (for example, at 1.8 V, which is referred to as a second power supply voltage) for low-voltage interface. This block diagram depicts the state where an interface signal of 1.8 V is inputted to the LSI, processed through internal logics, and then outputted from the LSI. The signal inputted from an input pad PAD_I is delivered to an internal logic circuit LGC through an input buffer IBF and a signal level conversion circuit (level down converter LDC) for conversion from an I/O (input/output) voltage (1.8 V) to the power supply voltage vdd of the logic circuit.

On the other hand, the signal level of the signal from the logic circuit LGC to the outside has to be converted to a signal level of the power supply voltage vcc_18 for I/O from the power supply voltage vdd of the logic circuit. At this time, as a feature of the present invention, after the signal amplitude is once amplified by a level up converter LUC to the vcc level which is a higher voltage, the resultant signal is amplified by a pre-buffer PBF, and then converted to an interface voltage vcc_18 in a main buffer MBF at the last stage for delivery. In this manner, the level conversion unit and the pre-buffer unit operation speed is degraded can be operated at high speed. Therefore, a low-voltage high-speed operation is possible even by the use of a high-withstand-voltage MISFET. The level conversion circuit used here can be achieved by using, for example, a level conversion circuit disclosed in Japanese. Patent Application Laid-Open Publication No. 2003-152096 (Patent Document 2).

Also, the level up converter LUC can be shared between the I/O for low voltage vcc_18 and the I/O for high voltage vcc, which makes it unnecessary to re-design the level conversion circuit. Therefore, an effect of reducing the number of design steps can be achieved. The level up converter disclosed in Patent Document 2 is a circuit for rapidly converting the signal amplitude of a low voltage (1 V or lower) to a high-voltage (3.3 V) amplitude, but it has a little complex structure. Therefore, if the level up converter can be shared by all I/O circuitries (all input/output circuitries), an effect of reducing design cost can be achieved.

Meanwhile, in the present embodiment, when the signal amplitude is converted from a vdd power supply voltage level to vcc_18 power supply voltage level, the signal amplitude is increased by the level conversion circuit and the pre-buffer and then driven. Therefore, there is a concern about an increase in power consumption. However, in a general I/O circuitry, since the load for driving the I/O circuitry is extremely large in comparison with the gate capacitance of an internal transistor, it does not cause any problem. For example, an external output load CL is defined in the specifications as 15 pF, which is extremely large. On the other hand, the gate width of the I/O circuitry is at most about 100 μm, and its capacitance is about several hundreds of fF. Therefore, it is evident that dominant power consumption is the power to charge and discharge the load capacitance CL by the main buffer MBF at the last stage and the power consumption in the level up converter LUC and the pre-buffer PBF is at a level that is negligible.

The leakage current is also at a level that is negligible. The reason is as follows. Since the leakage current tends to be proportional to a drain-source voltage, the leakage current is increased in comparison with a leakage current at the time of application of 1.8 V. However, since the high-withstand-voltage MISFET inherently has a high threshold value, in view of the leakage current on the entire SoC chip, the leakage current becomes an amount that is negligible.

Furthermore, another feature of the present embodiment lies in that, since the level up converter and the pre-buffer are shared by the low-voltage I/O circuitry and the high-voltage I/O circuitry, the structure of the level up converter and the pre-buffer which determine the characteristics of the I/O circuitry can be determined almost independently of the voltage at the last stage. Thus, coarse adjustment and some fine adjustment of the characteristics can be achieved only with one type of voltage specification (for example, 3V, which is a voltage value allowing a 10% decrease as a future margin in the case of a high voltage of 3.3 V). For this reason, another effect of attaining stable performance with short TAT and at low cost can be achieved.

Therefore, according to the semiconductor integrated circuit device of the present embodiment, the operation speed of 1.8 V I/O can be increased by driving the level conversion unit and the pre-buffer unit at a high voltage.

Also, the level conversion unit and the pre-buffer unit can be shared by 3.3 V I/O and 1.8 V I/O. Further, when the applied voltage of 3.3 V is used in common, the shared use of components and extraction of cell characteristics can be easily attained.

In FIG. 1, the ground potential of the input circuit and the ground potential of the level conversion circuit of the output circuit are equal to that of the internal logic circuit, that is, vss. This is because, since the main buffer MBF of the output circuit is formed of an extremely large transistor, when the transistor is turned ON and OFF, the ground potential vssc of the main buffer MBF and the pre-buffer PBF of the output circuit may include a large noise. By preventing such noise from being included in the input circuit and the level conversion circuit, effects of mitigating degradation in operation speed, improving signal quality, and the like can be achieved. Note that, if such a situation would not occur in a product, the ground potential vssc for I/O can be used for designing the input circuit and the level conversion circuit.

Figure 2A:
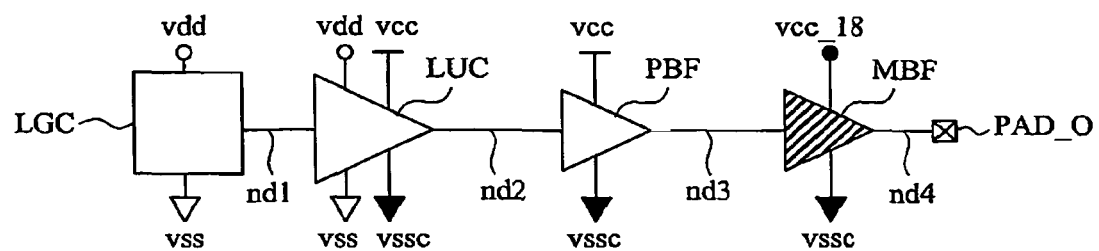
FIG. 2A is a diagram depicting a structure example of I/O circuitry at an output side in the semiconductor integrated circuit device according to one embodiment of the present embodiment.
Figure 2B:
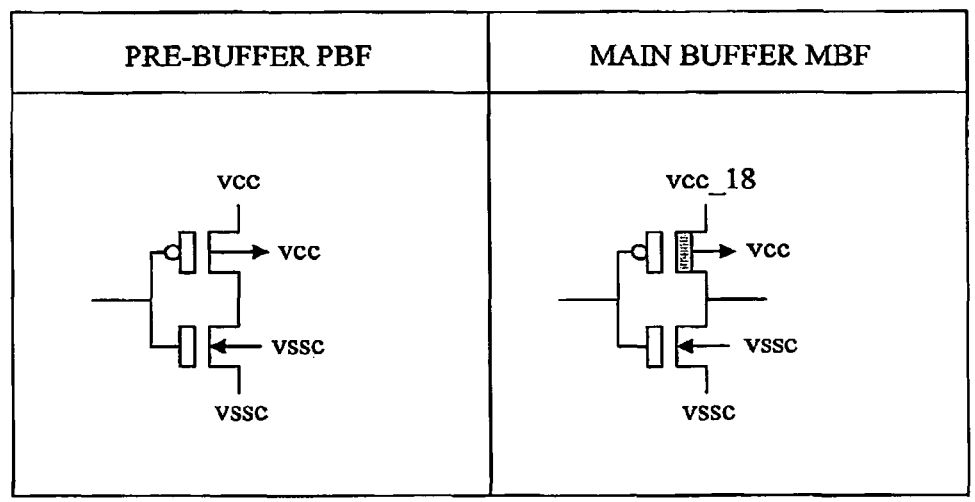
FIG. 2B is a diagram depicting a structure example of I/O circuitry at an output side in the semiconductor integrated circuit device according to one embodiment of the present embodiment.

Next, the structure of an I/O circuitry OIOC at the output side will be described. FIG. 2 shows the structure of an I/O circuitry OIOC at the output side, in which FIG. 2A schematically depicts the I/O circuitry OIOC at the output side and FIG. 2B depicts a power supply for each terminal of a transistor of the I/O circuitry OIOC.

First, the general outline of the I/O circuitry OIOC at the output side will be described with reference to FIG. 2A. The level up converter LUC is a circuit having a function to increase a signal amplitude, and is operated by applying a vdd power supply voltage for use in the internal logic circuit and a vcc power supply voltage with a high potential. The pre-buffer PBF is driven at the high voltage vcc.

The main buffer MBF at the last stage is driven at the vcc_18 power supply voltage, which is an interface power supply voltage. FIG. 2A and FIG. 2B depict the case where a P type MISFET has a substrate terminal connected to vcc and a source terminal connected to vcc_18, as one example of the structure of this main buffer MBF. Also, in this example, a threshold voltage of the P type MISFET is set low.

Although not shown, in the case where a MISFET with a low threshold value is not used as the P type MISFET of the main buffer MBF, a gate width W is set wide so as to secure a driving current of this P type MISFET.

However, in a normal process, an analog transistor that handles mixed signals is set in many cases, and in most cases, such a transistor is formed of a MISFET with a low threshold voltage. Therefore, when such a MISFET is used, a high-speed low-voltage I/O circuitry can be realized without increasing the number of process steps or the number of masks. For this reason, an embodiment using such a MISFET is mainly described here.

FIG. 2B is a circuit diagram of the pre-buffer PBF and the main buffer MBF shown in FIG. 2A. Although I/O circuitry is generally complex because it includes an enable signal, a driving magnification switching signal, and others, I/O circuitry will be described here as an inverter serving as the simplest amplifying circuit. The present invention can also be applied to the I/O circuitry having a complex function other than the inverter.

The pre-buffer PBF is formed of a MISFET to which vcc is supposed to be applied, and its threshold voltage is designed as a standard circuitry to which vcc is supplied.

On the other hand, a MISFET similar to that of the pre-buffer is used for an N type MISFET of the main buffer MBF. However, a MISFET with a reduced threshold voltage, which is obtained by changing the implantation for a channel of a MISFET, is used for a P type MISFET. Since a potential of a substrate electrode VB is vcc and a potential of a source electrode VS is vcc_18 in this P type MISFET, a substrate bias effect occurs. Also, since the operating voltage of the preceding pre-buffer PBF is vcc, the output thereof becomes a high output state at the vcc level. Therefore, on condition that the P type MISFET of the main buffer MBF is turned OFF (when the gate voltage of the P type MISFET is vcc), a so-called negative gate voltage effect (since the P type MISFET is used in this case, a gate voltage is higher than the source voltage, and it is strongly turned OFF) works together with the substrate bias effect, and thus, it is possible to reduce the leakage.

Figure 3:
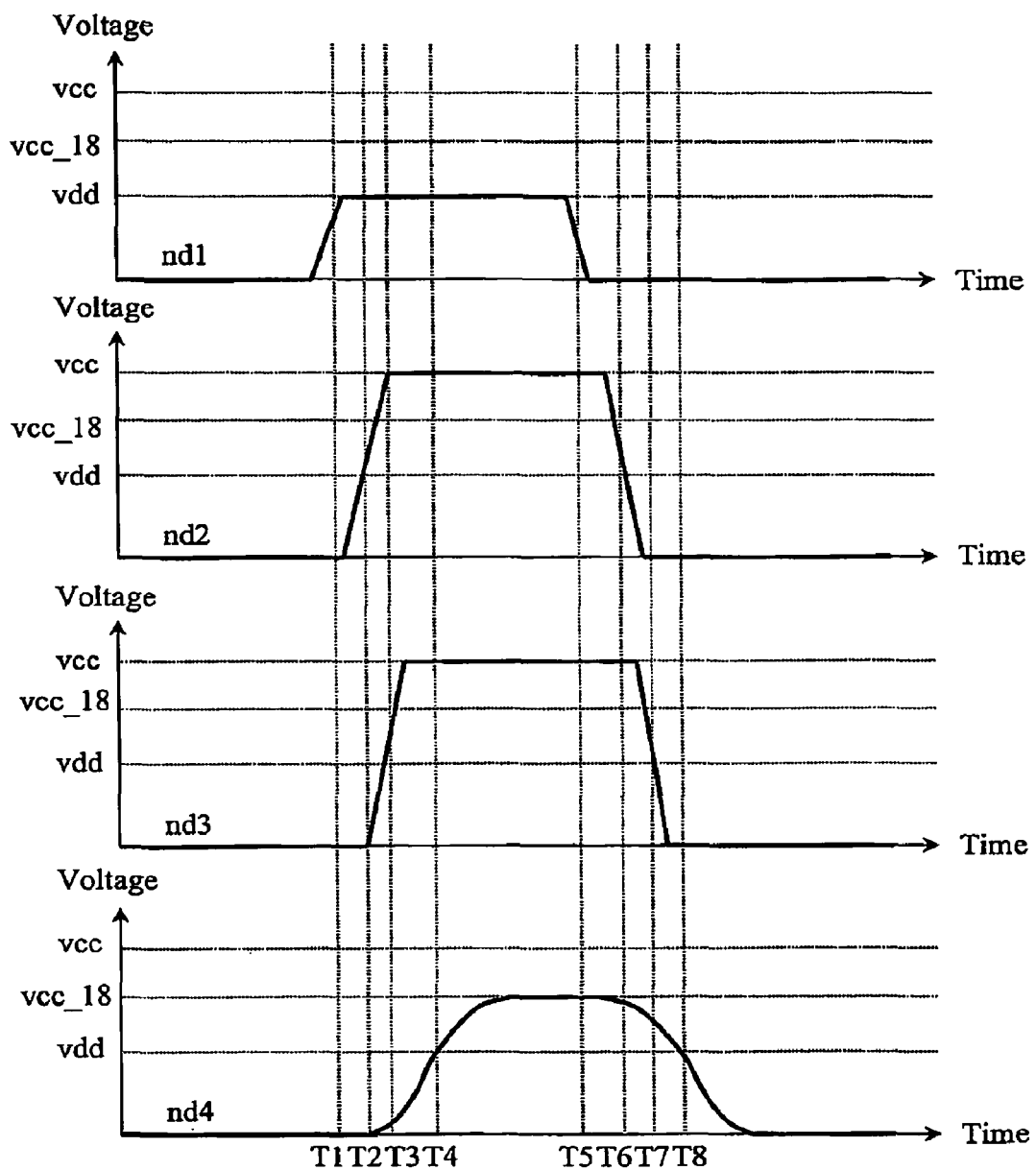
FIG. 3 is a waveform diagram showing the operation of the I/O circuitry at the output side in FIG. 2.

FIG. 3 is an operating waveform diagram of the I/O circuitry at the output side shown in FIG. 2. The case where an output node nd1 from the internal logic circuit LGC has an amplitude of a vdd voltage and makes a transition at a time T1 from a low level (vss level) to a high level (vdd level) will be described. It is hereinafter defined that a transition is made at the time when the amplitude of the signal becomes half. The signal from the node nd1 is then inputted to the level up converter LUC, where the signal amplitude is converted to a vcc level. Due to the delay time of the level up converter, an output node nd2 of the level up converter makes a transition at a time T2 from a low level (vssc level) to a high level (vcc level). In this example, since a buffer-type level up converter is assumed, the logic of the node nd1 and that of the node nd2 match with each other. However, when an inverter-type level up converter is used, a similar signal level conversion is performed except that the logic is inverted. Then, the signal from the node nd2 is inputted to the pre-buffer PBF, where a driving force is amplified to a driving force sufficient to drive the main buffer MBF. Since the pre-buffer PBF is operated also at the vcc power supply voltage, the signal amplitude at an output node nd3 of the pre-buffer PBF is equal to the amplitude of the vcc power supply voltage at the node nd2. In this example, in consideration of the amount of delay in the pre-buffer PBF, a transition is made at a time T3 from a low level (vssc level) to a high level (vcc level). Then, the signal from the node nd3 is inputted to the main buffer MBF, and the main buffer MBF drives an external high load through an output pad PAD_O. Since the main buffer MBF is driven at the vcc_18 power supply voltage, the amplitude at an output node nd4 is equal to the amplitude of the vcc_18 power supply voltage. Also, this example depicts the case of an obtuse output waveform of the main buffer MBF due to a large external load, and a transition is made at a time T4 from a low level (vssc level) to a high level (vcc_18 level).

Next, the case where a transition is made at a time T5 from a high level (vdd level) to a low level (vss) will be described. The signal from the node nd1 is then inputted to the level up converter LUC, where the signal amplitude is converted to a vcc level. Due to the delay time of the level up converter, the output node nd2 of the level up converter makes a transition at a time T6 from a high level (vcc level) to a low level (vssc level). In this example, since a buffer-type level up converter is assumed, the logic of the node nd1 and that of the node nd2 match with each other. However, when an inverter-type level up converter is used, a similar signal level conversion is performed except that the logic is inverted. Then, the signal from the node nd2 is inputted to the pre-buffer PBF, where a driving force is amplified to a driving force sufficient to drive the main buffer MBF. Since the pre-buffer PBF is operated also at the vcc power supply voltage, the signal amplitude at the output node nd3 of the pre-buffer PBF is equal to the amplitude of the vcc power supply voltage at the node nd2. In this example, in consideration of the amount of delay in the pre-buffer PBF, a transition is made at a time T7 from a high level (vcc level) to a low level (vssc level). Then, the signal from the node nd3 is inputted to the main buffer MBF, and the main buffer MBF drives an external high load through the output pad PAD_O. Since the main buffer MBF is driven at the vcc_18 power supply voltage, the amplitude at the output node nd4 is equal to the amplitude of the vcc_18 power supply voltage. Also, this example depicts the case of an obtuse output waveform of the main buffer MBF due to a large external load, and a transition is made at a time T8 from a high level (vcc_18 level) to a low level (vssc level).

Figure 4:
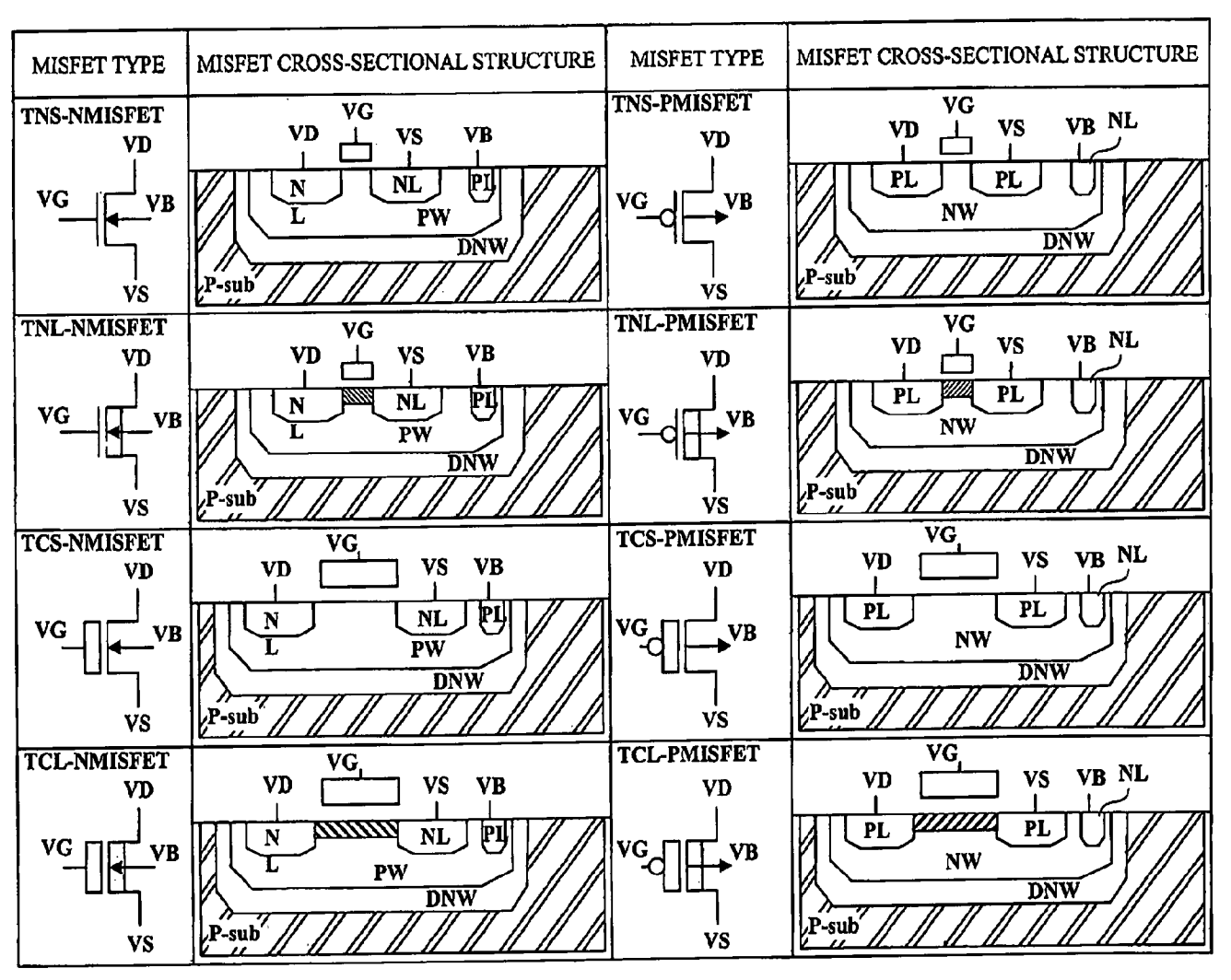

FIG. 4 is a drawing that depicts examples of the MISFETs for use in the present embodiment together with their cross-sectional views. In FIG. 4, VG denotes a gate electrode, VD denotes a drain electrode, VS denotes a source electrode, and VB denotes a substrate electrode. In this drawing, MISFETs having a thin gate insulating film whose gate electrode is symbolized by a line and MISFETs having a thick gate insulating film whose gate electrode is symbolized by a rectangular box are shown, in which they are classified according to whether the type is an N type or a P type and according to the magnitude of the threshold voltage.

The gate insulating film thickness of the MISFET for use in the internal logic circuit is designed to be about 2 nm, and the MISFET having a thick gate insulating film thickness for use in the I/O circuitry is designed to have the gate insulating film thickness larger than that of the MISFET for use in the internal logic circuit, that is, have the gate insulating film thickness about 6 to 7 nm, for example.

A TNS-NMISFET is an N type MISFET with a thin-film standard threshold voltage for use in the internal logic circuit, and a TNS-PMISFET is a P type MISFET with a thin-film standard threshold voltage.

A TNL-NMISFET is an N type MISFET with a thin-film low threshold voltage for use in the internal logic circuit, and a TNL-PMISFET is a P type MISFET with a thin-film low threshold voltage.

A TCS-NMISFET is an N type MISFET with a thick-film standard threshold voltage for use in the I/O circuitry, and a TCS-PMISFET is a P type MISFET with a thick-film standard threshold voltage.

A TCL-NMISFET is an N type MISFET with a thick-film low threshold voltage for use in the I/O circuitry, and a TCL-PMISFET is a P type MISFET with a thick-film low threshold voltage.

This example shows the transistors having a so-called triple well structure, in which a deep N well DNW is formed on a P type semiconductor substrate P-sub and then an N well NW for forming a P type MISFET and a P well PW for forming an N type MISFET are formed on the deep N well DNW. Alternatively, a double well structure, which has only the N well NW and the P well PW without using the deep N well DNW, is also possible. In the low-threshold-voltage MISFET, the threshold voltage of the MISFET is reduced by providing additional implantation for a channel portion of the transistor. An N type diffusion layer NL corresponds to a diffusion layer implanted area of the N type MISFET and a diffusion layer implanted area for substrate power supply of the P type MISFET, and a P type diffusion layer PL corresponds to a diffusion layer implanted area of the P type MISFET and a diffusion layer implanted area for substrate power supply of the N type MISFET.

Figure 5:
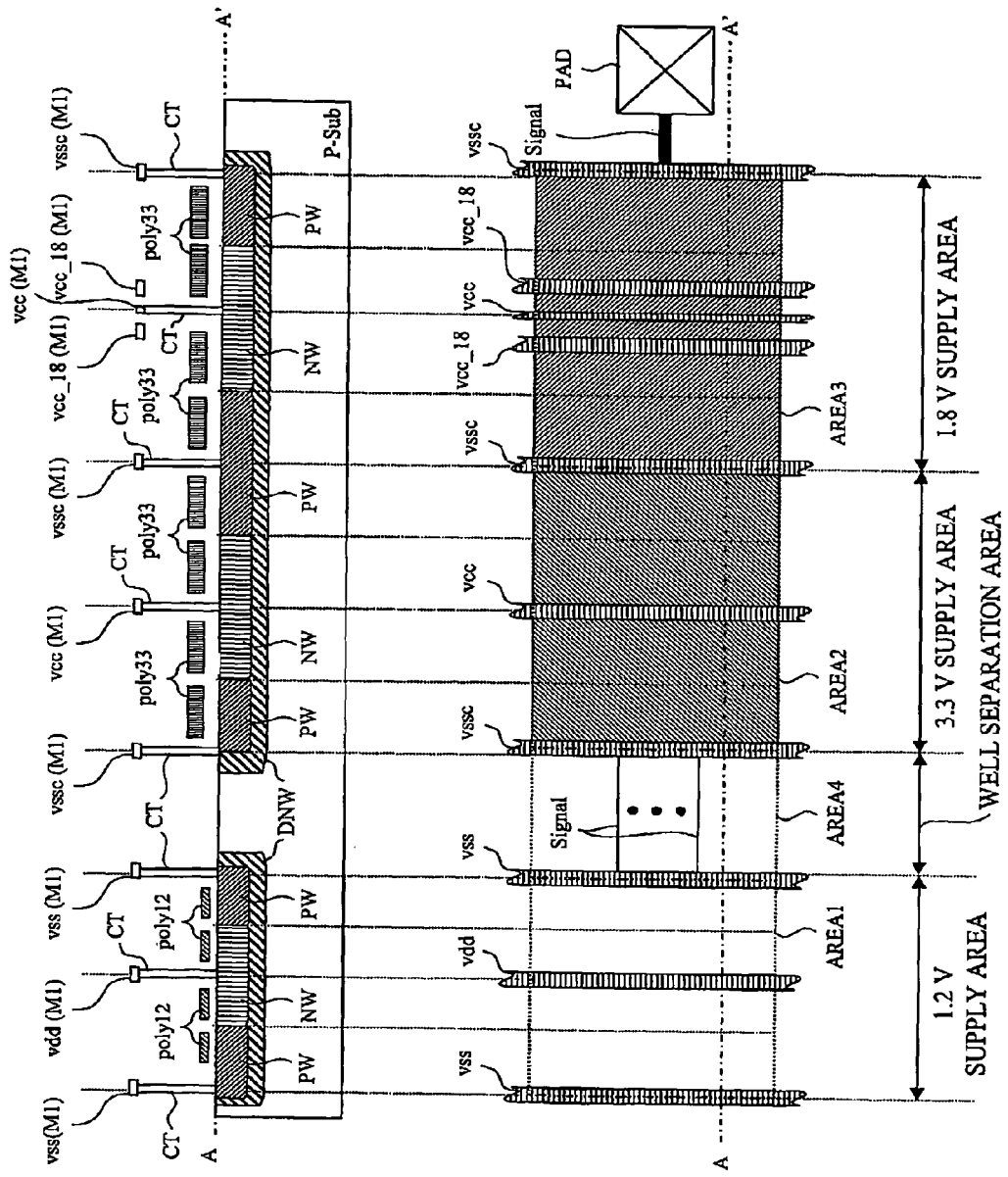
FIG. 5 is a drawing of a layout example of the I/O circuitry in FIG. 2 and a cross-sectional structure thereof.

FIG. 5 depicts a layout example of the I/O circuitry. In this layout example, the I/O circuitry at the output side shown in FIG. 2 is assumed, and a layout area is broadly divided into four areas. In this case, a conceptual plan view of the layout is shown in a lower portion of the drawing, and a cross-sectional view thereof taken along A-A' of the plan view is shown in an upper portion thereof. For the purpose of simplification, FIG. 5 depicts an example in which each area has two cells laid out in a back-to-back manner (two sets of an N type MISFET and a P type MISFET). In an actual layout, the size of each area can be defined in accordance with the restrictions on a vertical direction and a horizontal direction, and the layout may be achieved with a different number of sets other than the number of sets shown in the drawing.

A first area AREA1 is an area to which vdd, which is a power supply voltage for the internal logic circuit, is applied, and is supplied with vdd and vss power supply voltages.

A second area AREA2 is an area to which vcc is applied, and is supplied with vcc and vssc power supply voltages.

A third area AREA3 is an area to which vcc_18 is applied, and is supplied with vcc_18 and vssc power supply voltages.

A fourth area AREA4 is a well separation area for electrically separating the first area and the second and third areas. When the double well structure is used, this fourth area can be narrowed. When the ground level power supply voltage vssc of the second and third areas is equal to the ground level power supply voltage vss of the first area, an LSI can be formed even without a deep N well DNW. Since substrate separation between vcc and vdd can be achieved only with the P well PW, no well separation area is required. However, since such a deep N well DNW is effective for noise separation, by separating power supplies of the first area and the second and third areas where power supply noise is heaviest, the effect of, for example, increasing the noise immunity can be obtained.

In the first area, a control logic of the I/O circuitry and a vdd applying unit for a level up converter and a level down converter are laid out. In the second area, a vcc applying unit for the level up converter and a pre-buffer are laid out. In the third area, a vcc_18 applying unit for the level down converter, a main buffer, and an ESD protective element are laid out.

In the third area AREA3 to which vcc_18 is applied, a substrate power supply is different from the power supply of the P type MISFET of the main buffer MBF. Therefore, the third area AREA3 is partially different from the second area AREA2 in layout. In this example, since power supply wiring in a cell is assumed to be formed with a metal first layer, one vcc power supply line and two vcc_18 power supply lines are used for layout. Since the vcc power supply supplies power only to the substrate of the P type MISFET, the amount of current supply can be smaller in comparison with vcc_18. Therefore, only a thin metal wiring is sufficient in this layout.

Next, the cross-sectional structure will be described. In the upper portion of FIG. 5, the cross section taken along A-A' shown in the drawing is schematically depicted. The structure depicted here is the case of a so-called triple well structure, in which the deep N well DNW is formed in the P type semiconductor substrate P-sub and then the N well NW for the P type MISFET and the P well PW for the N type MISFET are formed on the deep N well DNW, thereby forming a MISFET. The transistor for the internal logic circuit is formed of a MISFET with a thin gate insulating film, and this MISFET uses polysilicon poly12 as a gate electrode. The transistor for I/O is formed of a MISFET with a thick gate insulating film, and this MISFET uses polysilicon poly33 as a gate electrode. Power supply to the substrate and source of each transistor is performed by using a metal first layer M1. Power is supplied to the substrate and source from the metal first layer M1 through a contact CT. In this case, only power supply to the substrate is shown, but power supply to the source electrode of the MISFET is performed similarly through a method known to those skilled in the art.

Figure 6:
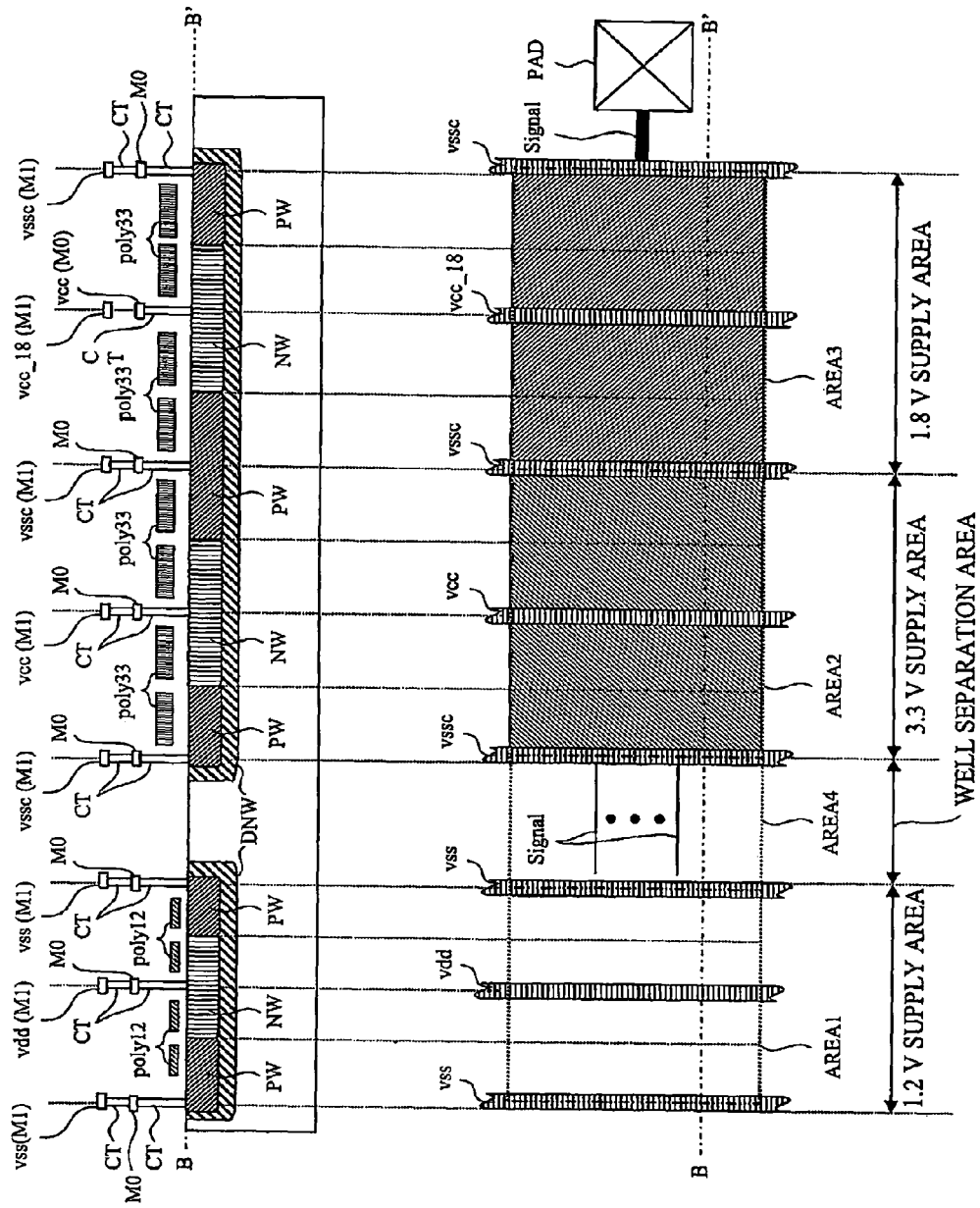
FIG. 6 is a drawing of another layout example of the I/O circuitry of FIG. 2 and a cross-sectional structure thereof.

FIG. 6 depicts a modification example of the layout depicted in FIG. 5, showing an embodiment in which two-layer metal wiring is used for power supply wiring. FIG. 6 also depicts a cross section taken along B-B'. Similar to FIG. 5, the metal first layer M1 is used to form power supply wiring. In addition, a metal zeroth layer M0 is used to strengthen the power supply. As described above, when two-layer power supply wiring is used, power supply to the substrate can be performed through the wiring of the metal zeroth layer M0, and the power supply to the source of the MISFET can be performed through the wiring of the metal first layer M1, which makes it possible to achieve the effects of area reduction, wiring flexibility improvement, and others. In the example shown in FIG. 6, different wiring layers are used for the wiring of the substrate and that of the source electrode of the P type MISFET of the main buffer MBF.

As is evident from FIG. 6, in this layout, only two power supply lines of the metal first layer are required for each cell. In a portion to which vcc_18 is applied, as shown in the cross-sectional view, no contact CT is provided between the metal first layer M1 and the metal zeroth layer M0 in order to separate the vcc_18 power supply and the vcc power supply. Other power supplies have a contact CT connected between the metal first layer M1 and the metal zeroth layer M0. The implementation of such a layout achieves effects of the flexibility increase in wiring of the metal first layer M1 and simplification of the layout.

Figure 7A:
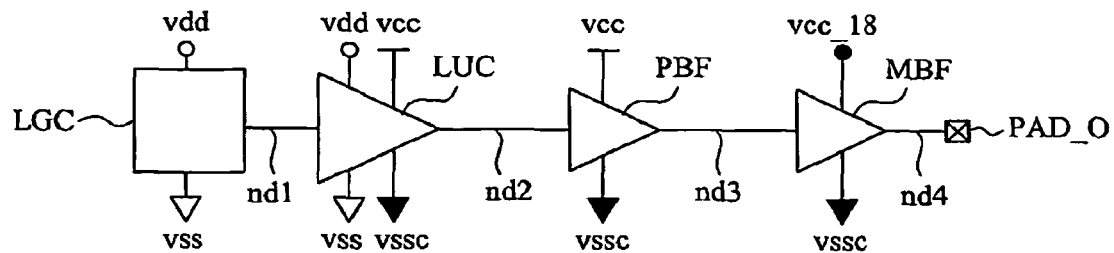
FIG. 7A is a drawing depicting another structure example of the I/O circuitry at the output side in the semiconductor integrated circuit device according to one embodiment of the present embodiment.
Figure 7B:
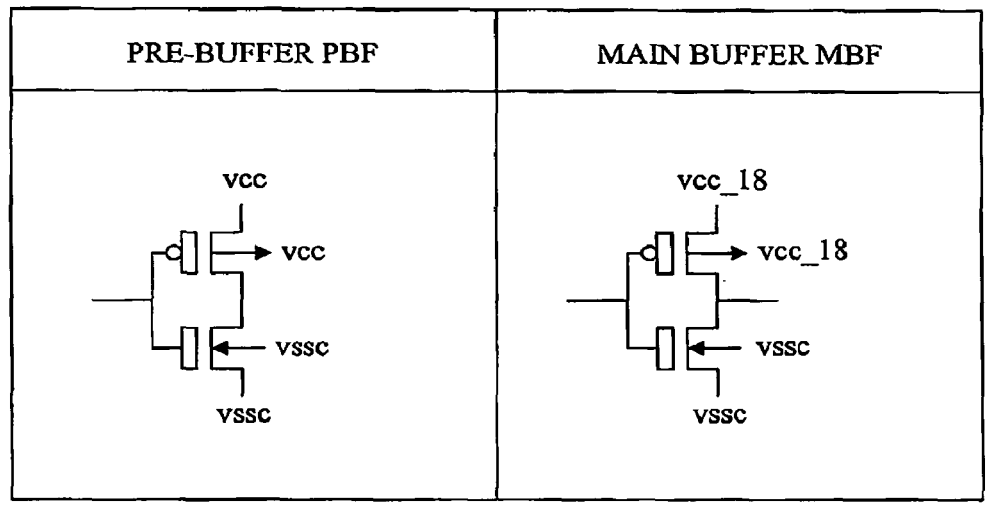
FIG. 7B is a drawing depicting another structure example of the I/O circuitry at the output side in the semiconductor integrated circuit device according to one embodiment of the present embodiment.

FIG. 7 is a drawing of another embodiment of the present invention. Similar to FIG. 2, FIG. 7 depicts an example of the I/O circuitry at the output side. FIG. 7A schematically depicts the I/O circuitry at the output side, and FIG. 7B depicts a power supply of each terminal of a transistor of the I/O circuitry.

First, the general outline of the I/O circuitry at the output side will be described with reference to FIG. 7A. The level up converter LUC is a circuit having a function to increase a signal amplitude, and is operated by applying a vdd power supply voltage for use in the internal logic circuit and a vcc power supply voltage with a high potential. The pre-buffer PBF is driven at the high voltage vcc. The main buffer MBF at the last stage is driven at the vcc_18 power supply voltage, which is an interface power supply voltage. Different from FIG. 2A and FIG. 2B, FIG. 7A and FIG. 7B depict one example of the structure of the main buffer MBF, in which a substrate electrode VB of a P type MISFET is connected to vcc_18 and the P type MISFET is formed of a MISFET with a standard threshold voltage.

FIG. 7B is a circuit diagram of the pre-buffer PBF and the main buffer MBF shown in FIG. 7A. Although I/O circuitry is generally complex because it includes an enable signal, a driving magnification switching signal, and others, I/O circuitry will be described here as an inverter serving as the simplest amplifying circuit. The present invention can also be applied to the I/O circuitry having a complex function other than the inverter. The pre-buffer PBF is formed of a MISFET to which vcc is supposed to be applied, and its threshold voltage is designed as a standard circuitry to which vcc is supplied. On the other hand, a MISFET similar to that of the pre-buffer PBF is used for an N type MISFET of the main buffer MBF. Since a potential of a substrate electrode is vcc and a potential of a source electrode VS is vcc_18 in this P type MISFET, on condition that the P type MISFET is turned OFF (when the gate voltage of the P type MISFET is vcc), the leakage can be reduced due to the negative gate voltage effect.

Figure 8:
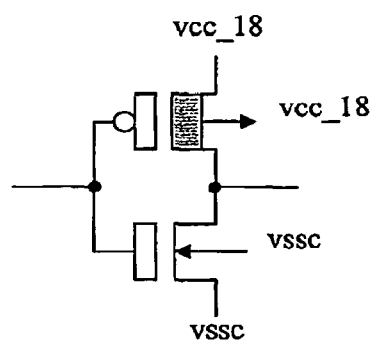
FIG. 8 is a drawing of another structure example of the main buffer shown in FIG. 7.

FIG. 8 depicts another embodiment of the main buffer MBF. A feature of this case lies in that a MISFET with a reduced threshold voltage is used as the P type MISFET of the main buffer shown in FIG. 7. Accordingly, since the driving force of the P type MISFET is increased, a pull-up of the output node becomes faster. As a result, the operation speed of the I/O circuitry at the output side can be increased.

Although not shown, making a gate length LG of the MISFET short will be effective in speed-up. This is because the current of the MISFET is approximately proportional to an inverse of the gate length.

Figure 9:
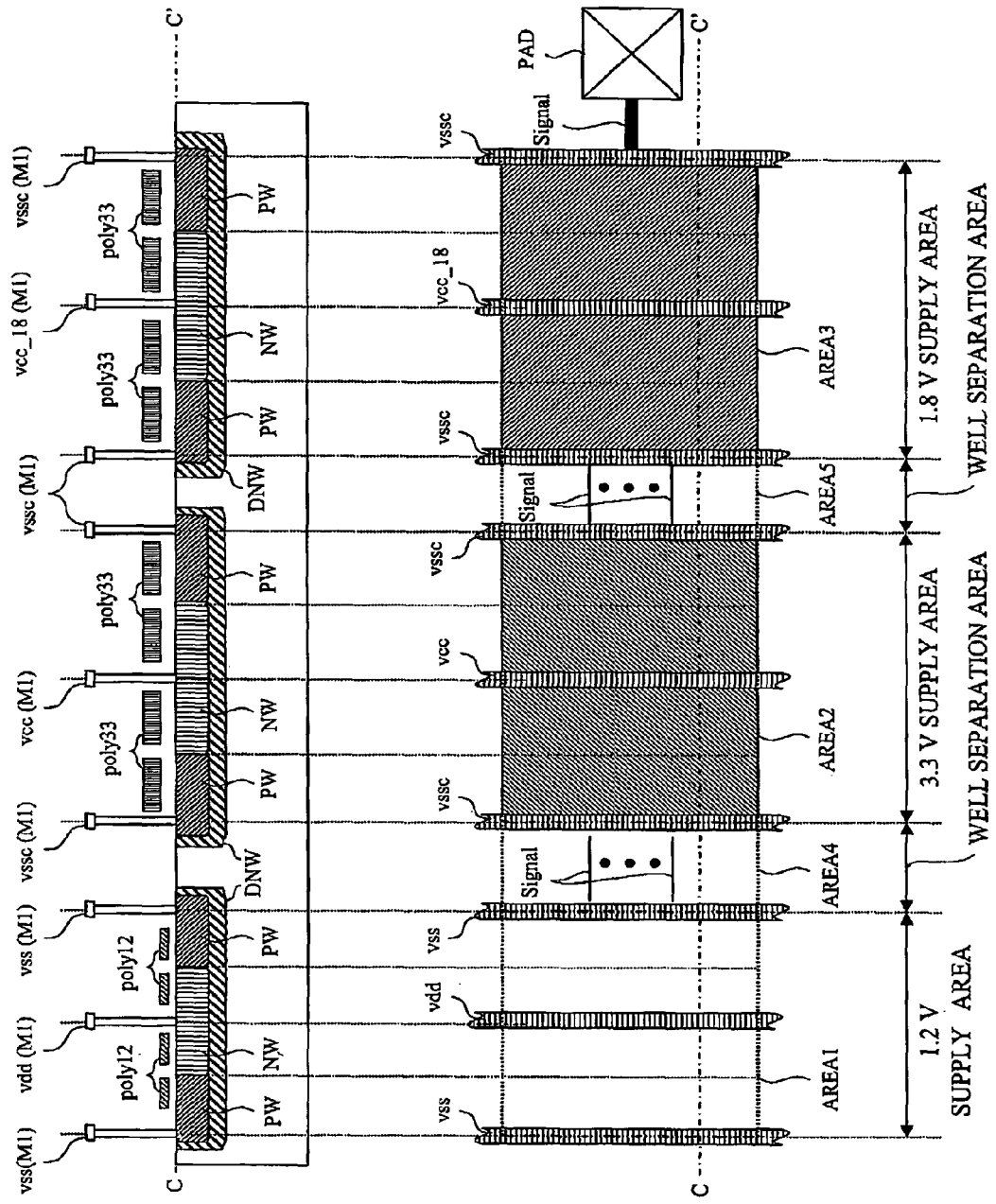
FIG. 9 is a drawing of a layout example of the I/O circuitry in FIG. 7 and a cross-sectional structure thereof.

FIG. 9 depicts a layout example of the structure of FIG. 7. In this layout example, the I/O circuitry at the output side shown in FIG. 7A and FIG. 7B is assumed, and a layout area is broadly divided into five areas. In this case, a conceptual plan view of the layout is shown in a lower portion of the drawing, and a cross-sectional view thereof taken along C-C' in the plan view is shown in an upper portion thereof. For the purpose of simplification, FIG. 9 depicts an example in which each area has two cells laid out in a back-to-back manner (two sets of an N type MISFET and a P type MISFET). In an actual layout, the size of each area can be defined in accordance with the restrictions on a vertical direction and a horizontal direction, and the layout may be achieved with a different number of sets other than the number of sets shown in the drawing. These five areas are classified by the substrate power supply of the MISFET.

A first area AREA1 is an area to which vdd, which is a power supply voltage for the internal logic circuit, is applied, and is supplied with vdd and vss power supply voltages. A second area AREA2 is an area to which vcc is applied, and is supplied with vcc and vssc power supply voltages. A third area AREA3 is an area to which vcc_18 is applied, and is supplied with vcc_18 and vssc power supply voltages. A fourth area AREA4 is a well separation area for electrically separating the first area and the second and third areas. A fifth area AREA5 is a well separation area for electrically separating the second area and the third area. This is because, since the substrate potential of the P type MISFET of the main buffer MBF is different from the substrate potential of the P type MISFET of the pre-buffer PBF and the level up converter LUC, substrate insulation is required between the main buffer MBF and the pre-buffer PBF.

The size of these fourth and fifth areas can be reduced when a double well structure is used. This is because, since the fifth area can form the substrate separation of vcc and vcc_18 by only the P well PW if the deep N well DNW is not set, separation of the deep N well DNW is not necessary. It is unnecessary to set this deep N well DNW when the ground level power supply voltage vssc of the second and third areas is equal to the ground level power supply voltage vss of the first area. However, since such a deep N well DNW is effective for noise separation, by separating power supplies of the first area and the second and third areas where power supply noise is heaviest, the effect of, for example, increasing the noise immunity can be obtained.

In this example, the case where power supply wiring is formed with the metal first layer M1 has been described. However, the wiring using the two or more metal wiring layers in which a metal zeroth layer M0 and a metal first layer M1 are used is also possible as shown in FIG. 6. In this case, effects of simplification of the layout and the area reduction can be achieved.

Figure 10A:
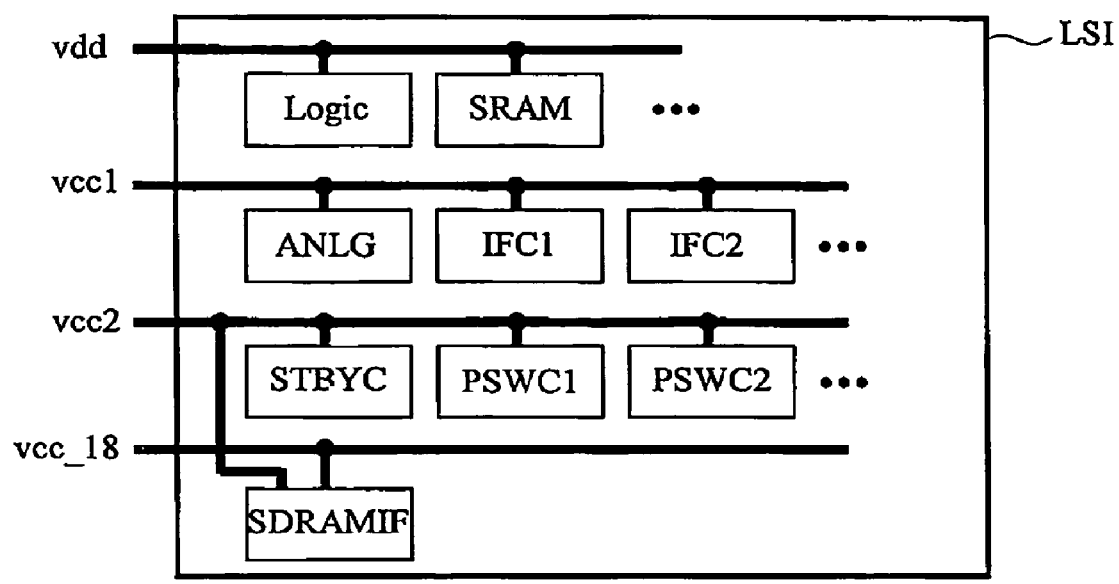
FIG. 10A is a block diagram showing one example of a power supply connection structure in the semiconductor integrated circuit device according to one embodiment of the present invention.
Figure 10B:
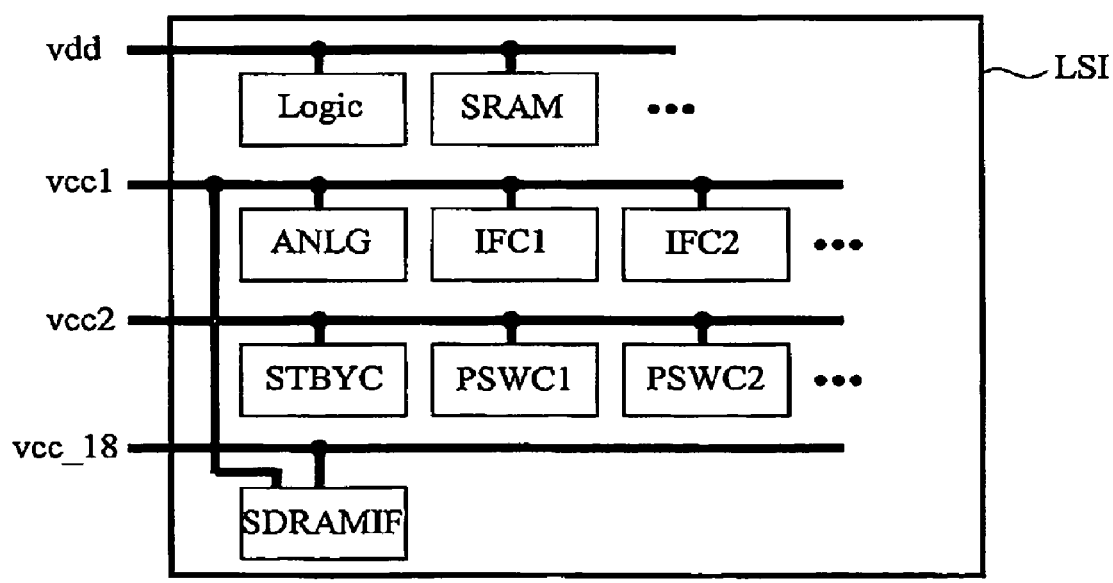
FIG. 10B is a block diagram showing another example of a power supply connection structure in the semiconductor integrated circuit device according to one embodiment of the present invention.

FIG. 10A and FIG. 10B are drawings that depict a power supply structure (power supply allocation) of an LSI to which the present invention is applied. FIG. 10A and FIG. 10B each depict a structure example including a vdd power supply, vcc1 power supply, a vcc2 power supply, and a vcc_18 power supply. For example, the vdd power supply is 1.2 V, vcc1 is 2.5V, vcc2 is 3.3 V, and vcc_18 is 1.8 V. Note that a ground level power supply is omitted. FIG. 10A depicts a state where vcc2 and vcc_18 are supplied to an input/output circuitry SDRAMIF for SDRAM, and FIG. 10B depicts a state where vcc1 and vcc_18 are supplied to the input/output circuitry SDRAMIF for SDRAM. The input buffer IBF, the pre-buffer PBF, the main buffer MBF, and other components shown in FIG. 1 are provided in the input/output circuitry SDRAMIF.

First, circuit blocks using the vdd power supply include a logic unit Logic such as a CPU and an SRAM which is an on-chip storage element. A plurality of such units and elements may be integrated. Furthermore, although not shown, these circuits may be operated at a different power supply voltage (for example, vdd2=0.9 V) as long as the voltage is below the withstand voltage of the MISFET. Circuit blocks using vcc1 include an analog circuit ANLG and input/output circuitries IFC1 and IFC2 for flash memories, which are off-chip storage elements, and others. A vcc2 power supply voltage is supplied to a standby circuit STBYC, which controls the chip even when the chip enters a standby state and a circuit block to which vdd is applied is cut off by an off-chip or on-chip power supply switch, and to control circuits PSWC1 and PSWC2 for an on-chip power supply cut-off switch. Circuit blocks using the vcc_18 power supply include the input/output circuitry SDRAMIF for the SDRAM, which is an external storage element. A voltage higher than vcc_18 is supplied to this SDRAMIF. In FIG. 10A, vcc2 which is the highest voltage of all is used. Depending on the specifications, even when vcc1 is used as shown in FIG. 10B, the speeding-up effect can be achieved although the operation is slower in comparison with the case of using vcc2.

In many cases, MISFETs forming the analog circuit ANLG, the input/output circuitries IFC1 and IFC2 for the flash memories and others, the standby circuit STBYC, the control circuits PSWC1 and PSWC2 for power supply cut-off switch, and the input/output circuitry SDRAMIF for the SDRAM have a thick gate insulating film. Also, the thickness of the gate insulating films thereof has the same design value. This achieves an effect of reducing manufacturing cost.

Figure 11:
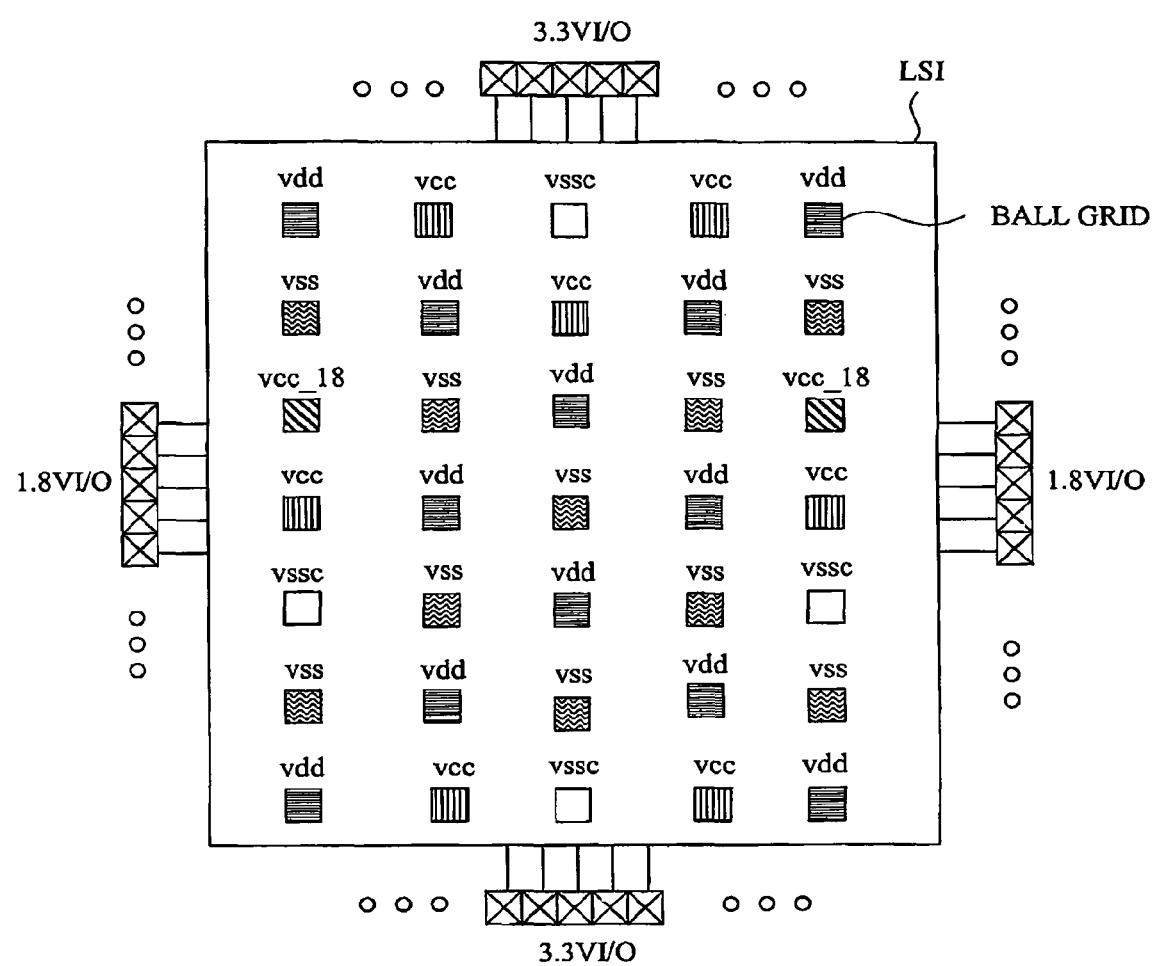
FIG. 11 is a drawing of one example of a power supply connection structure on a package in the semiconductor integrated circuit device according to one embodiment of the present invention.

FIG. 11 is a conceptual drawing of a connection of I/O circuitries for an LSI and power supply terminals. In FIG. 11, ball-grid-type power supply wiring is shown, in which power supplies are taken from the upper surface of the LSI chip. With the progress of miniaturization in manufacturing process, a method in which power supplies inside the LSI are directly bonded from the upper surface of the chip so as to avoid a voltage drop has become dominant. At this time, if vcc_18, vssc, and vcc power supplies are arranged on the upper portion of the chip near 1.8 V I/O circuitry driven at a low voltage, it is possible to achieve the highest power supply performance and to simplify the layout. In FIG. 11, the ball grid arrangement is implemented so that vss and vdd are evenly arranged. Depending on the LSI, however, power consumption is not uniform in some cases. In such a case, it is preferable to arrange the ball grids for power supply so that large power can be given to the circuit blocks that consume an electric current most.

Figure 12:
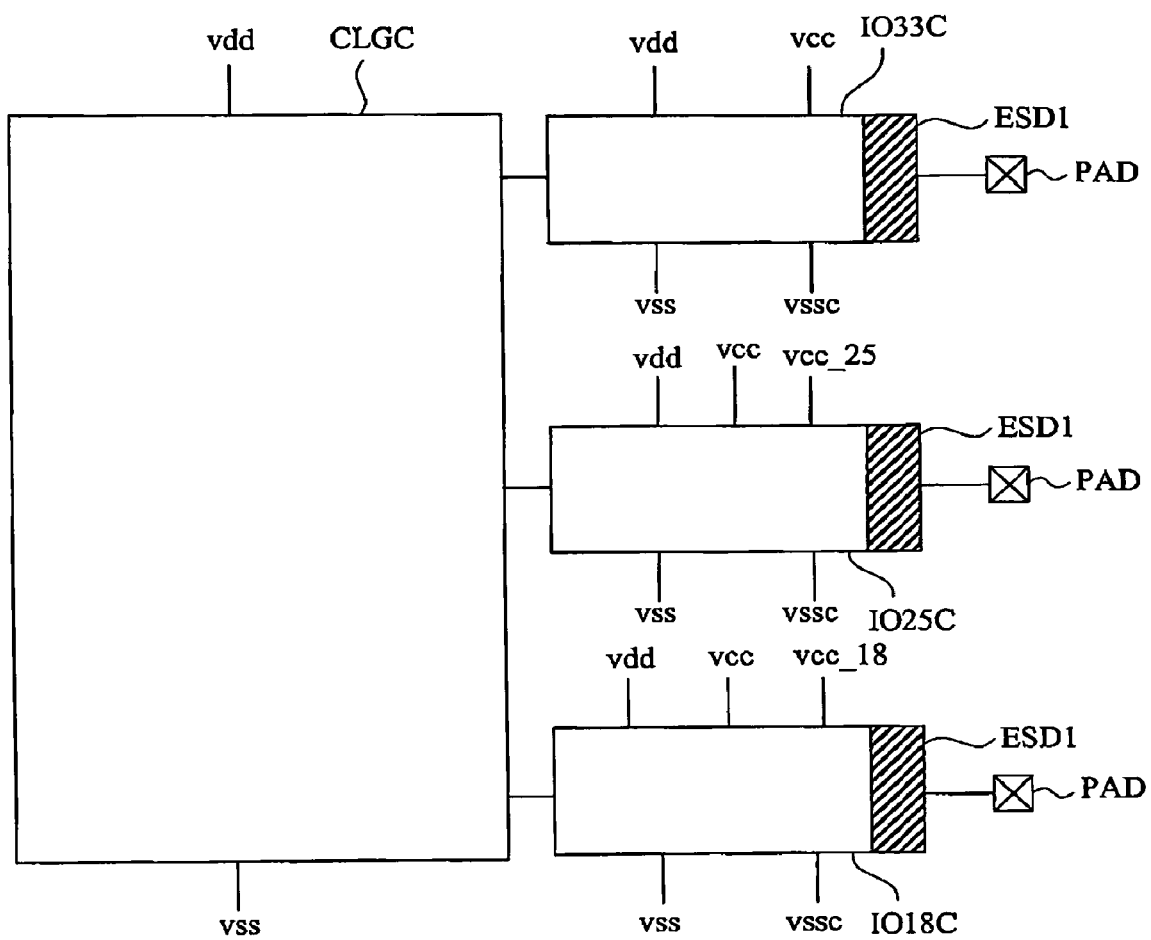
FIG. 12 is a block diagram of a structure example when the present invention is applied to a semiconductor integrated circuit device having a plurality of I/O power supplies.

FIG. 12 depicts another embodiment of the I/O circuitry. In this case, three types of I/O circuitry are shown. For the purpose of simplification, only an output system from an internal logic circuit CLGC to the outside of the chip is shown. Each of the I/O circuitries is an I/O circuitry IO18C operated at the lowest voltage (for example, 1.8 V), an I/O circuitry IO33C operated at the highest voltage (for example, 3.3 V), and an I/O circuitry IO25C operated at an intermediate voltage therebetween (for example 2.5 V).

The I/O circuitry IO33C has operating voltages of vdd and vcc and their ground levels of vss and vssc. Also, the I/O circuitry IO33C has a protective element ESD1 for protecting the inside of the LSI from external static and others.

The I/O circuitry IO25C has operating voltages of vdd and vcc_25 and their ground levels of vss and vssc. Also, the I/O circuitry IO25C has the protective element ESD1 for protecting the inside of the LSI from external static and others.

The I/O circuitry IO18C has operating voltages of vdd and vcc_18 and their ground levels of vss and vssc. Also, the I/O circuitry IO18C has the protective element ESD1 for protecting the inside of the LSI from external static and others. Note that the I/O circuitry shown in FIG. 1 corresponds to the I/O circuitry IO18C.

The MISFETs which form these I/O circuitries include two types. One is the MISFET having a thin gate insulating film and designed to operate at a vdd power supply voltage, and the other is the MISFET having a thick gate insulating film and designed to operate at a vcc power supply voltage.

All protective elements ESD1 are formed of the same circuits. For example, a MISFET operating at vcc is used as an active element.

By adopting such a circuit, protective elements can be used in common, and an effect of reducing design cost can be achieved.

Figure 13:
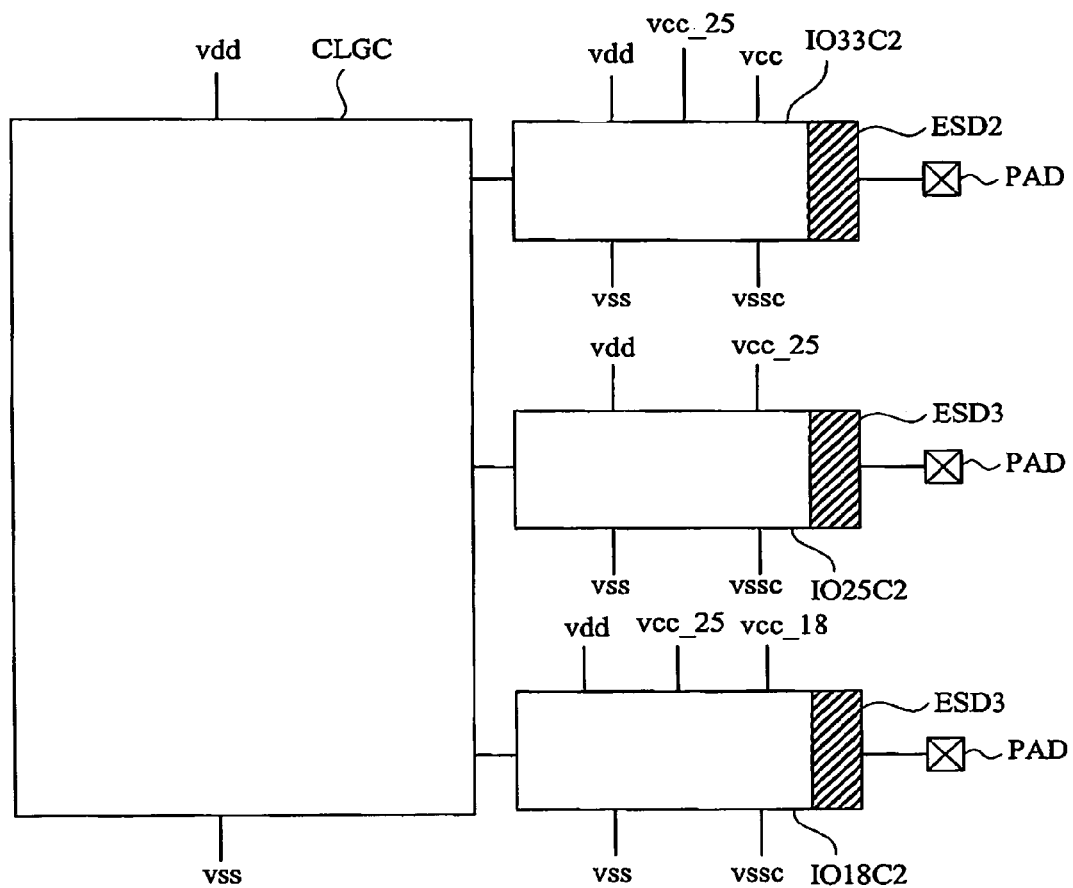
FIG. 13 is a block diagram of another structure example when the present invention is applied to a semiconductor integrated circuit device having a plurality of I/O power supplies.

FIG. 13 is a modification example of FIG. 12, that is, another embodiment of the I/O circuitry. In this case, three types of I/O circuitry are shown. For the purpose of simplification, only an output system from the internal logic circuit CLGC to the outside of the chip is shown. Each of the I/O circuitries is an I/O circuitry IO18C2 operated at the lowest voltage (for example, 1.8 V), an I/O circuitry IO33C2 operated at the highest voltage (for example, 3.3 V), and an I/O circuitry IO25C2 operated at an intermediate voltage therebetween (for example, 2.5 V).

The I/O circuitry IO33C2 has operating voltages of vdd, vcc, and vcc_25 and their ground levels of vss and vssc. Different from IO33C shown in FIG. 12, this circuitry has a MISFET formed based on the assumption that it is operated by a vcc_25 power supply. Such a MISFET to be operated by vcc_25 has a feature that its gate insulating film is thinner than that of a MISFET supposed to be operated at vcc. Therefore, higher-speed operation at a lower voltage (for example, 2.5 V) is possible in comparison with the case where the circuitry is formed by using a MISFET for vcc. However, if a vcc power supply voltage is directly applied to operate this MISFET supposed to be operated by vcc_25, the voltage exceeds the withstand voltage of the gate insulating film, and the MISFET is destroyed. Also, the I/O circuitry IO33C2 has a protective element ESD2 for protecting the inside of the LSI from external static and others. Different from ESD1, this ESD2 uses a MISFET operated at vcc_25 as an active element. However, if a vcc power supply voltage is directly applied to operate this MISFET supposed to be operated at vcc_25, the gate insulating film is destroyed. For its prevention, a circuitry measure for suppressing a maximum applied voltage is required for this ESD2 circuit.

The I/O circuitry IO25C2 has operating voltages of vdd and vcc_25 and their ground levels of vss and vssc. This circuitry is similar to IO25C shown in FIG. 12, but the gate insulating film of the MISFET to which vcc_25 is applied is thinner than that of the MISFET for use in IO25C. Also, the I/O circuitry IO25C2 has a protective element ESD3 for protecting the inside of the LSI from external static and others. Different from ESD1, this ESD3 uses a MISFET supposed to be operated at vcc_25 as an active element.

The I/O circuitry IO18C2 has operating voltages of vdd, vcc_18, and vcc_25 and their ground levels of vss and vssc. This circuitry is similar to the I/O circuitry IO18C shown in FIG. 12, but the gate insulating film of the MISFET to which vcc_25 and vcc_18 are applied is thinner than that of the MISFET for use in the I/O circuitry IO18C. Also, the I/O circuitry IO18C2 has the protective element ESD3 for protecting the inside of the LSI from external static and others. Different from ESD1, this ESD3 uses a MISFET supposed to be operated at vcc_25 as an active element. Note that the I/O circuitry shown in FIG. 1 corresponds to the I/O circuitry IO18C2.

The MISFETs which form these I/O circuitries include two types. One is the MISFET having a thin gate insulating film and designed to operate at a vdd power supply voltage, and the other is the MISFET having a thick gate insulating film and designed to operate at a vcc power supply voltage. Furthermore, in the circuitry IO33C2, destruction of the gate insulating film has to be prevented when using the vcc power supply for the MISFET designed for vcc_25 power supply.

If this circuitry is used, the MISFET optimized for application of a vcc_25 voltage can be used as a MISFET with a high withstand voltage. Therefore, the circuitry to which a vcc_25 power supply voltage is applied can be operated at high speed.

Figure 14:
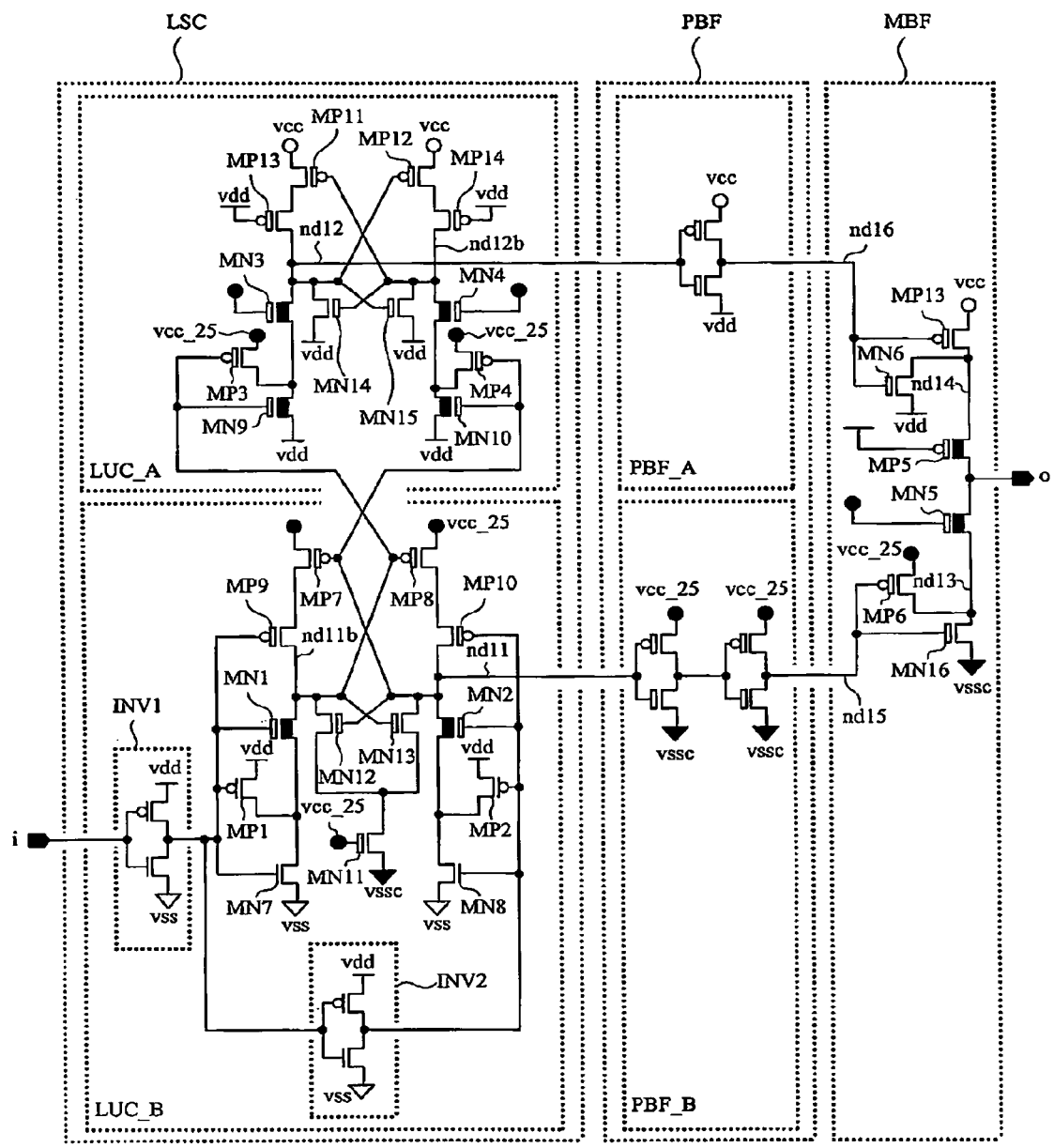
FIG. 14 is a circuit diagram of a structure example of an I/O circuitry (withstand voltage mitigation circuit) of FIG. 13.

FIG. 14 depicts one embodiment of the I/O circuitry IO33C2 shown in FIG. 13. In FIG. 14, a level up converter LSC, a pre-buffer PBF, and a main buffer MBF are shown. A feature of this case lies in that a MISFET having a thin gate insulating film for use in an internal logic circuit and a MISFET optimized for a vcc_25 voltage for I/O are used as the MISFETs. In FIG. 14, reference characters identical to those in FIG. 4 are used for description, and it is assumed that a maximum applied voltage for a MISFET having a thick gate insulating film is vcc_25. By using the MISFETs described above, a high-speed operation under a vcc_25 voltage can be achieved in comparison with the case of a MISFET designed based on the assumption that a vcc power supply voltage is applied and having a thicker gate insulating film.

Meanwhile, a vcc power supply voltage cannot be directly applied to this MISFET. This is because the gate insulating film of this MISFET does not have a sufficient thickness to endure the application of vcc. Therefore, in order to achieve the operation by the vcc power supply, the maximum applied voltage to this MISFET has to be suppressed to the vcc_25 voltage or lower. Thus, in the present embodiment, a withstand voltage mitigation mechanism described below capable of suppressing the maximum applied voltage to the MISFET to vcc_25 is provided in order to enable the vcc operation.

First, the connecting relation of this circuitry will be described. An input of the level up converter LSC is first supplied to LUC_B, where a signal having an amplitude between a vdd power supply voltage and a vss power supply voltage is converted to a signal having an amplitude between a vcc_25 power supply voltage and the vss power supply voltage. This circuit outputs complementary signals nd11 and nd11b. Output signals thereof are inputted to LUC_A, where they are converted to signals having an amplitude of a vcc power supply voltage and a vdd power supply voltage. An output of LUC_A is a signal nd12b. The outputs of LUC_A and LUC_B, that is, nd11 and nd12 are then inputted to the pre-buffer PBF. The pre-buffer PBF is composed of PBF_A and PBF_B as shown in FIG. 14. PBF_A amplifies a driving force of a signal which makes a transition from the power supply voltage vdd to the power supply voltage vcc, and PBF_B amplifies a driving force of a signal which makes a transition from the power supply voltage vssc to the power supply voltage vcc_25. Outputs of the pre-buffer PBF are a signal nd16 from PBF_A and a signal nd15 from PBF_B, and they are inputted to the main buffer MBF.

In this case, a MISFET having a low threshold value is used for each of MN1, MN2, MN3, MN4, MN9, MN10, MN5, and MP5. This is because, since these MISFETs are used for the purpose of mitigating the withstand voltage, a gate-source voltage is low. If there is no problem even when the operation speed is decreased a little, these MISFETs can be replaced, by MISFETs having a standard threshold voltage. In this case, effects of simplifying a manufacturing process and reducing the cost can be achieved.

Next, the operation of the circuitry shown in FIG. 14 will be described.

The case where an input signal i is at a high level (vdd) will be described.

At this time, in LUC_B, an output of an inverter INV1 is inputted to MISFETs MN1, MN7, MP1, and MP9, and an output of an inverter INV2 receiving the output signal of the inverter INV1 is inputted to MISFETs MN2, MN8, MP2, and MP10. As a result, since nd11 becomes a low level (vss), MP7 is turned ON. Since MP9 is turned ON, nd11b becomes a high level (vcc_25).

When nd11 becomes a low level (vss) and nd11b becomes a high level (vcc_25), in LUC_A, MP3 is turned OFF, MN9 is turned ON, MP4 is turned ON, and MN10 is turned OFF. Since MP11 is turned OFF and MN3 is turned ON, nd12 becomes a low level (vdd), MP12 is turned ON, and nd12b becomes a high level (vcc). MP13 and MP14 are always in an ON state. These MISFETs MP13 and MP14 are used for the purpose of suppressing an electric current, so as to make a transition to a low level at high speed at the time of signal level conversion. MP13 and MP14 can be omitted if a desired performance can be obtained without these MISFETs. In this case, an area reduction effect can be achieved. As described above, the operation of the level conversion circuit is defined.

Two signals whose signal amplitude is converted by the level up converter LSC are buffered by the pre-buffer PBF to a driving force sufficient to drive the main buffer MBF at the last stage. At this time, since nd11 is at a low level, nd15 is at a low level (vssc). On the other hand, since nd12 is at a high level (vcc), nd16 becomes a low level (vdd). These outputs from the pre-buffer PBF are inputted to the main buffer MBF. In the main buffer MBF, since nd15 is at a low level, MN16 is turned OFF and MP6 is turned ON. Therefore, since nd13 becomes a vcc_25 potential and the gate potential of MN5 is vcc_25 power supply voltage, MN5 is also turned OFF. On the other hand, since nd16 is at a low level (vdd), MP13 is turned ON and MN6 is turned OFF. Therefore, since nd14 is becomes vcc potential and the gate potential of MP5 is vdd, MP5 is also in an ON state. Consequently, an output o is at a vcc level.

Next, the case where the input signal i is at a low level (vss) will be described.

At this time, in LUC_B, an output of the inverter INV1 is inputted to the MISFETs MN1, MN7, MP1, and MP9, and an output of the inverter INV2 receiving the output signal of the inverter INV1 is inputted to the MISFETs MN2, MN8, MP2, and MP10. As a result, since nd11b becomes a low level (vss), MP8 is turned ON and MP10 is turned ON. Thus, nd11 becomes a high level (vcc_25).

When nd11b is at a low level (vss) and nd11 is at a high level (vcc_25), in LUC_A, MP4 is turned OFF, MN10 is turned ON, MP3 is turned ON, and MN9 is turned OFF. As a result, MP12 is turned OFF. Since MN4 is turned ON, nd12b becomes a low level (vdd). As a result, MP11 is turned ON and nd12 becomes a high level (vcc). At this time, MP13 and MP14 are always in an ON state. These MISFETs MP13 and MP14 are used for the purpose of suppressing an electric current, so as to make a transition to a low level at high speed at the time of signal level conversion. MP13 and MP14 can be omitted if a desired performance can be obtained without these MISFETs. In this case, an area reduction effect can be achieved.

As described above, the operation of the level conversion circuit is defined.

Two signals whose signal amplitude is converted by the level up converter LSC are buffered by the pre-buffer PBF to a driving force sufficient to drive the main buffer MBF at the last stage. At this time, since nd11 is at a high level (vcc_25), nd15 is at a high level (vcc_25). On the other hand, since nd12 is at a low level (vdd), nd16 becomes a high level (vcc). These outputs from the pre-buffer PBF are inputted to the main buffer MBF. In the main buffer MBF, since nd15 is at a high level, MN16 is turned ON and MP6 is turned OFF. Therefore, since nd13 becomes a vssc potential and the gate potential of MN5 is at vcc_25, MN5 is also turned ON. On the other hand, since nd16 is at a high level (vcc), MP13 is turned OFF and MN6 is turned ON. Therefore, since nd14 is at a vdd potential and the gate potential of MP5 is at vdd, MP5 is also in an OFF state. Consequently, the output o is at a vssc level.

Figure 15:
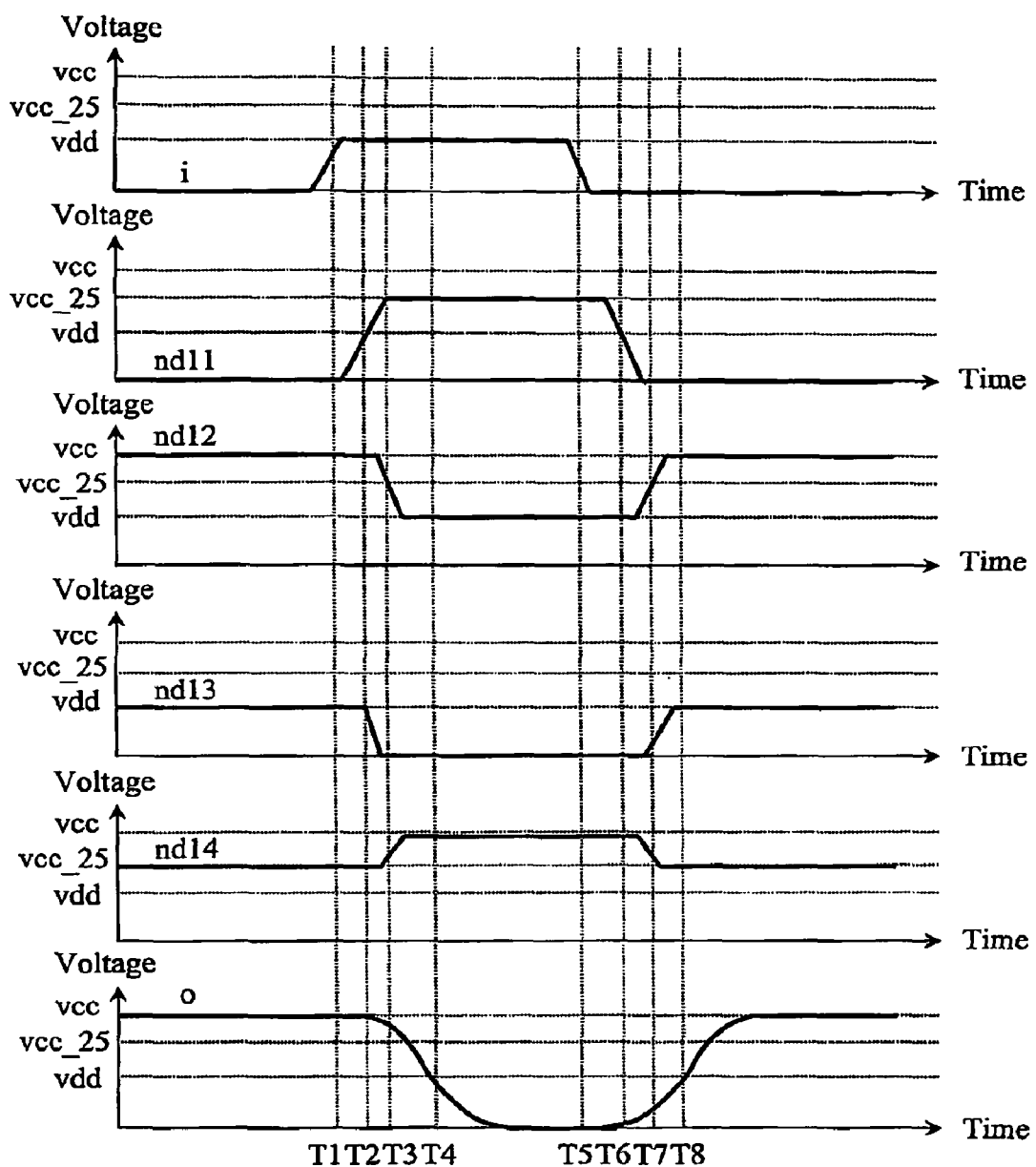
FIG. 15 is a waveform diagram showing the operation of the I/O circuitry of FIG. 14.

FIG. 15 is an operational waveform diagram of main nodes in the I/O circuitry of FIG. 14.

Next, the withstand voltage mitigation will be described.

The MISFETs MN1 to MN6 and MP1 to MP6 shown in FIG. 14 form a withstand voltage mitigation mechanism. When the gate voltage of MN1 is at a low level, MP1 is turned ON, and the source side of MN1 becomes vdd. A voltage relation at this time will be shown.

As for MN7, the gate voltage is vss, the source voltage is vss, and the drain voltage is vdd. Therefore, MN7 is within the maximum applied voltage of a MISFET having a thin gate insulating film.

As for MP1, the gate voltage is vss, the source voltage is vdd, and the drain voltage is vdd. Therefore, MP1 is within the maximum applied voltage of a MISFET having a thin gate insulating film.

As for MN1, the gate voltage is vss, the source voltage is vdd, and the drain voltage is vcc_25. Therefore, MN1 is within the maximum applied voltage of a MISFET having a thick gate insulating film. On the other hand, if the gate voltage of MN1 is at a high level (vdd), MP1 is turned OFF and the source side of MN1 becomes vss. A voltage relation at this time will be shown.

As for MN7, the gate voltage is vdd, the source voltage is vss, and the drain voltage is vss. Therefore, MN7 is within the maximum applied voltage of a MISFET having a thin gate insulating film.

As for MP1, the gate voltage is vdd, the source voltage is vdd, and the drain voltage is vss. Therefore, MP1 is within the maximum applied voltage of a MISFET having a thin gate insulating film. As for MN1, the gate voltage is vdd, the source voltage is vss, and the drain voltage is vss. Therefore, MN1 is within the maximum applied voltage of a MISFET having a thick gate insulating film.

In this case, a purpose is to suppress the maximum applied voltage of MN7 below vdd as described above. MN8, MN2, and MP2 have similar function, and the maximum applied voltage of MN8 can be suppressed below vdd. Next, a withstand voltage mitigation mechanism forming LUC_A will be described.

The case where nd11 is at a low level (vss) will be described.

At this time, as for MN10, the gate voltage is vss, the source voltage is vdd, and the drain voltage is vcc_25. Therefore, MN10 is within the maximum applied voltage of a MISFET having a thick gate insulating film.

As for MP4, the gate voltage is vss, the source voltage is vcc_25, and the drain voltage is vcc_25. Therefore, MP4 is within the maximum applied voltage of a MISFET having a thick gate insulating film.

As for MN4, the gate voltage is vcc_25, the source voltage is vcc_25, and the drain voltage is vcc. Therefore, MN4 is within the maximum applied voltage of a MISFET having a thick gate insulating film.

The case where nd11 is at a high level (vcc_25) will be described.

As for MN10, the gate voltage is vcc_25, the source voltage is vdd, and the drain voltage is vdd. Therefore, MN10 is within the maximum applied voltage of a MISFET having a thick gate insulating film.

As for MP4, the gate voltage is vcc_25, the source voltage is vcc_25, and the drain voltage is vdd. Therefore, MP4 is within the maximum applied voltage of a MISFET having a thick gate insulating film.

As for MN4, the gate voltage is vcc_25, the source voltage is vdd, and the drain voltage is vdd. Therefore, MN4 is within the maximum applied voltage of a MISFET having a thick gate insulating film.

In this case, a purpose is to suppress the maximum applied voltage of MN10 below (vcc-vcc_25) as described above. MN9, MN3, and MP3 have similar function, and the maximum applied voltage of MN8 can be suppressed below (vcc-vcc_25).

In the foregoing, the I/O circuitry using a MISFET with a high withstand voltage and operated at high speed with a voltage lower than the withstand voltage of the MISFET has been described. However, if the operating speed slower than that of the embodiment shown in FIG. 1 does not cause any problem, the level up converter may be changed.

Figure 16:
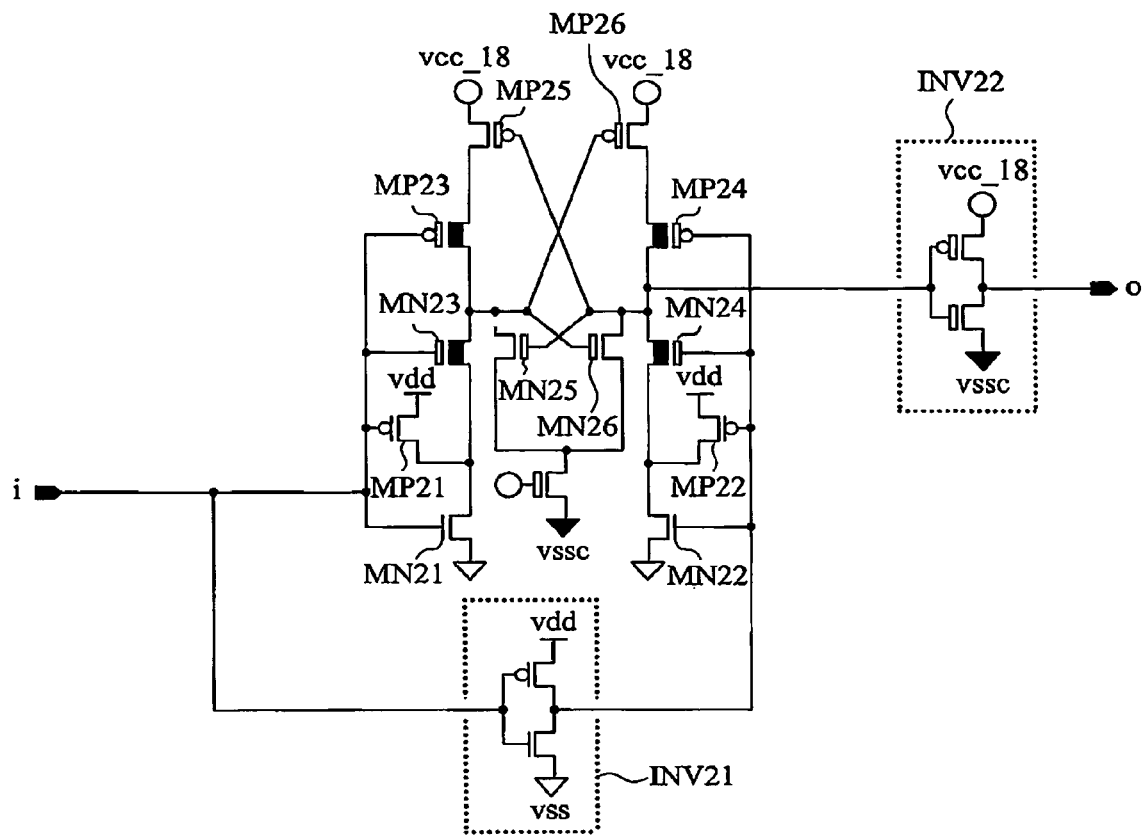
FIG. 16 is a circuit diagram of a structure example of a level conversion circuit in the semiconductor integrated circuit device according to one embodiment of the present invention.

FIG. 16 depicts another embodiment in which a MISFET supposed to be operated at a vcc power supply voltage is used, but the MISFET is operated at a lower power supply voltage vcc_18. FIG. 16 shows a level up converter, and conventional circuits are used for a pre-buffer and a main buffer. In this case, since two types of wiring for power supply are not required, an effect of reducing design complexity can be achieved.

Next, this circuit (level up converter) will be described. In this level up converter, MN21, MN22, MP21, MP22, and an inverter INV21 are formed of MISFETs having a thin gate insulating film, and other MN23, MN24, MN25, MN26, MP23, MP24, MP25, MP26 and an inverter INV22 are formed of MISFETs having a thick gate insulating film to which a vcc power supply voltage can be applied.

This circuit is a cross-couple-type level conversion circuit similar to a standard level conversion circuit. A feature of the present embodiment lies in that MP23 and MP24 for current control are formed of MISFETs having a threshold voltage lower than that of MP25 and MP26, and MN23 and MN24 are formed of MISFETs having a threshold voltage lower than that of MN25 and MN26. Note that, MN25 and MN26 function as a latch for keeping the state at the time of cut-off of power supply and performing a stable operation. Since the MISFET having a thick gate insulating film is designed to be operated at vcc (for example, 3.3 V), if it is operated at vcc_18 (for example, 1.8 V), the saturation current of the MISFET is decreased. The level up converter achieves signal amplitude conversion by extracting a current with the MISFETs of MN21 and MN22. Therefore, for example, when an input signal is changed from low to high, MP23 is controlled to be OFF, thereby achieving high-speed conversion. Thus, MP23 and MP24 are effective for the purpose of limiting a current path to the vcc_18 power supply at the time of level conversion. However, since the MISFET originally designed to be operated at vcc is operated at the vcc_18 power supply voltage, when the input i becomes a high level, the driving current for raising the drain of MP23 to a vcc_18 power supply voltage level is decreased, and the operation speed is decreased. For its prevention, by reducing the threshold voltage of these MP23 and MP24, the raising to the vcc_18 level can be performed at high speed. Accordingly, even when the operation power supply voltage is low, the operation speed of the level up converter can be increased. The same goes for MN25 and MN26, in which the threshold voltage is reduced in order to prevent an operational delay due to the use of MISFETs having a thick gate insulating film. In the present embodiment, an N type MISFET in which a vcc_18 power supply voltage is applied to a gate for the purpose of current control is used at the source side of each of MN25 and MN26. This MISFET limits the driving capability of MN25 and MN26, which makes it possible to achieve a high-speed operation of the level conversion circuit. When the gate length of this MISFET is increased, the threshold value is effectively increased, and thus, a current suppression effect is also increased. This N type MISFET is not imperative, and if a desired performance is satisfied without this N type MISFET, the design without this N type MISFET is possible. In that case, an area reduction effect can be achieved, for example.

Hereinafter, the case where the I/O circuitry driven by a voltage higher than a power supply voltage for use in an interface according to the present invention is applied to SSTL will be described.

Figure 17:
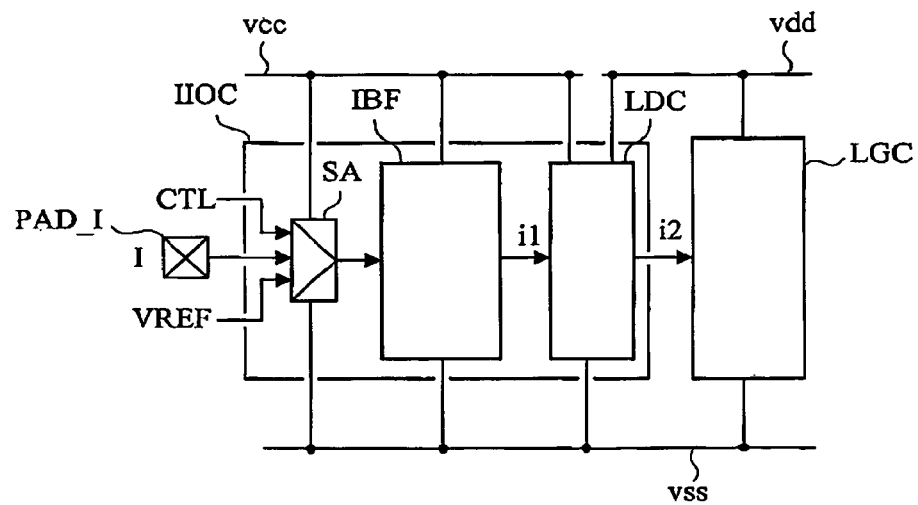
FIG. 17 is a block diagram of a structure example of an input circuit when the present invention is applied to SSTL2.

FIG. 17 depicts one embodiment of an input circuit satisfying specifications of SSTL2 standards of 1.8 V. In the SSTL2 standards of 1.8 V, an input signal is not delivered as a so-called full-amplitude signal which makes a transition exactly between 0 V and vcc_18 but delivered as a signal having the maximum amplitude of smaller than 1.8 V, where a half voltage of vcc_18 is set to be the center of the amplitude as a reference voltage (VREF) (if vcc_18 is 1.8 V, VREF=0.9 V). A feature of the present embodiment lies in that a differential amplifier SA is provided at an input, and a power supply of this differential amplifier SA is driven by a vcc power supply. Accordingly, even when a transistor to which a vcc power supply voltage is supposed to be applied is used, a signal having an amplitude of 1.8 V, which is a low voltage, can be stably amplified at high speed, and a high-quality signal can be delivered to the subsequent stage. An output of the differential amplifier SA is inputted to an input buffer IBF as a full-amplitude signal and then delivered through a level conversion circuit to an internal logic.

Note that, when the vdd voltage is low, for example, 1 V, vdd can be used as VREF. In this circuit, all ground levels are at a ground power supply voltage vss, which is used in the internal logic circuit. This is because a large noise on a power supply line generated by an output buffer is cut off at the input circuit side.

Figure 18:
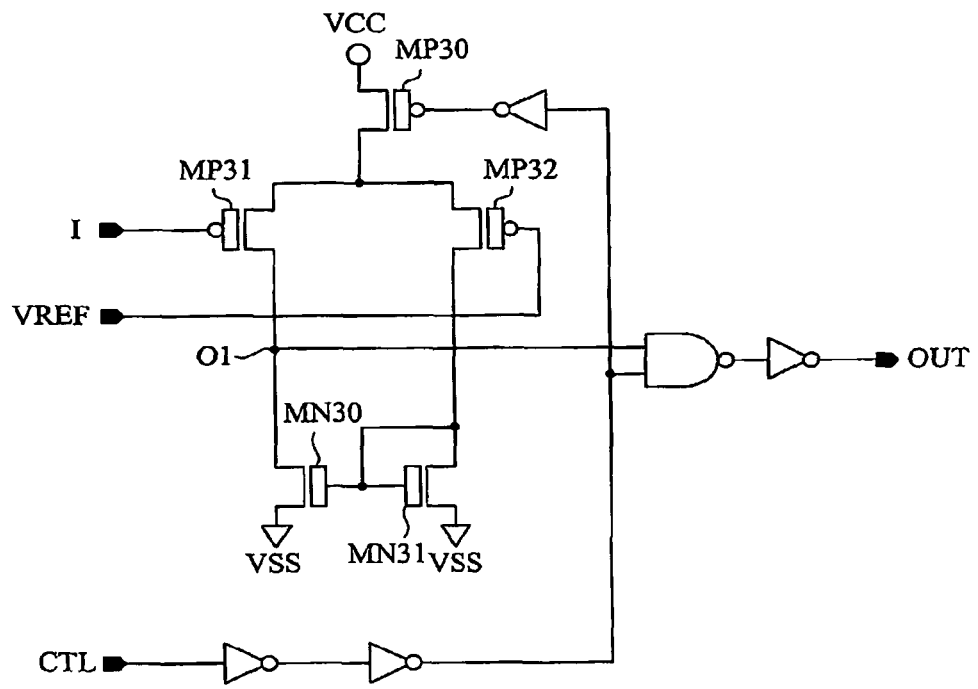
FIG. 18 is a circuit diagram of a structure example of a differential amplifier of FIG. 17.

FIG. 18 is a drawing of a circuit example of the differential amplifier SA shown in FIG. 17. In FIG. 18, the differential amplifier SA uses a differential-type amplifier. A feature of this circuit lies in that, when a power supply level of an input signal is 1.8 V, the power supply of a sense amplifier receiving the input signal is operated not at 1.8 V but at a high voltage of 3.3 V, thereby providing a circuit that stably operates at high speed by using a transistor optimized for 3.3 V. The differential amplifier SA shown in this embodiment shows an example of a general differential-type operational amplifier. Since the input signal level of this circuit and the voltage level of VREF (vcc_18/2=0.9 V) are low, a method in which a voltage is sensed at a P type MISFET is taken. This is because, since the gate voltage is as low as about 1 V, by increasing the source-drain voltage and the source-gate voltage of the P type MISFET to 3.3 V, the transistor can be operated in a so-called saturation area of the transistor.

In view of a circuitry characteristic of the differential amplifier SA being a current-amplifying-type amplifier, it is necessary that a current always flows through this differential amplifier SA so as to sense the voltage level. For the reduction of power consumption, this current is required to be eliminated at the time of non-operation. For its achievement, the current-control P type MISFET of the sense amplifier is turned OFF by setting a control signal CTL at a low level, thereby cutting off the current flowing through the operational amplifier. At this time, since an output O1 of the sense amplifier is in a floating state, there is the possibility that a through current occurs in a circuit at a subsequent stage. Therefore, by setting the CTL signal to low, an output of a NAND circuit is fixed to high, which can prevent such a through current in this NAND circuit.

Figure 19:
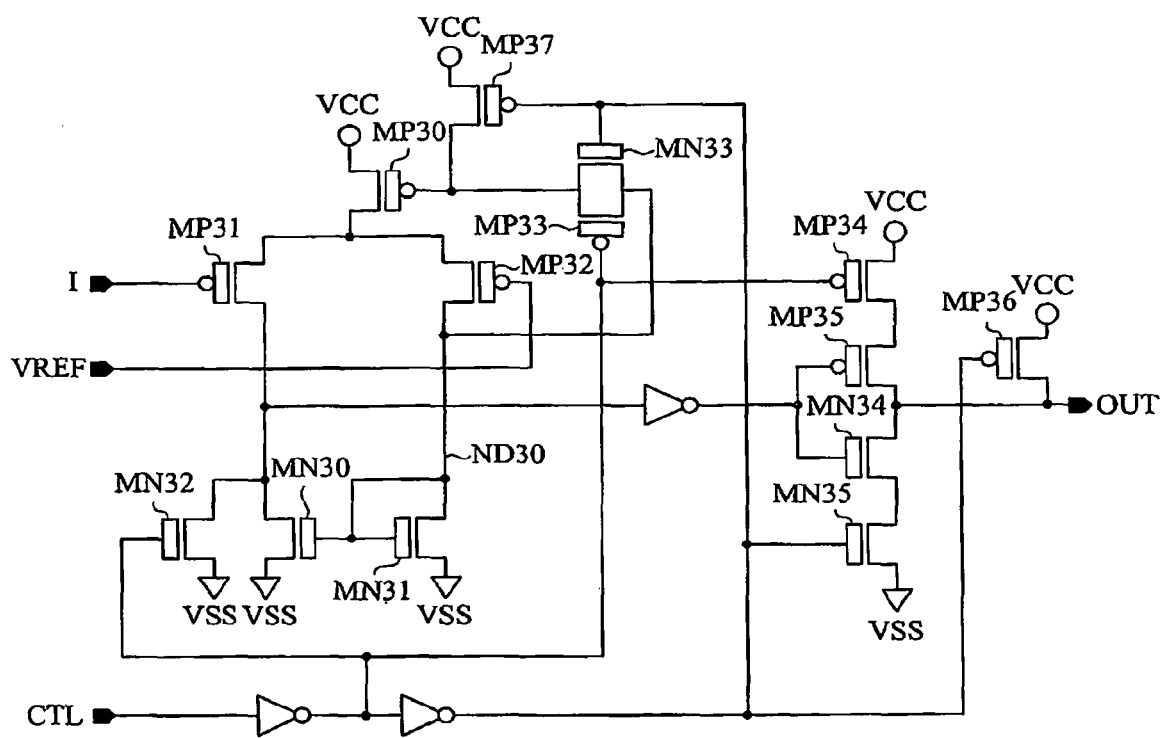
FIG. 19 is a circuit diagram of another structure example of the differential amplifier of FIG. 17.

FIG. 19 depicts another embodiment of the input circuit shown in FIG. 16. This circuit is formed in order to improve the gain and offset characteristics of the operational amplifier by applying a bias voltage to the gate of a current-control P type MISFET MP30 of the operational amplifier. Normally, in a standard operational amplifier, the voltage generated from a bias generating circuit is applied to the P type MISFET. In the I/O circuitry, however, such a bias generating circuit is difficult to provide in some cases. In that case, in view of the fact that a node ND30 in the operational amplifier can serve as some sort of bias generating circuit, its voltage can be used as a bias voltage. Also in this circuit, unnecessary current consumption has to be suppressed at the time of non-operation, and therefore, it is necessary to perform current consumption reduction control by the use of a control signal CTL. By setting the control signal CTL to low, a transmission gate formed of MN33 and MP33 is turned OFF, and gates of ND30 and MP30 are cut off. Simultaneously, since a P type MISFET of MP37 is turned ON, the gate voltage of MP30 becomes vcc, and the power supply of the operational amplifier is cut off. At this time, in association with the cut-off of the power supply of the operational amplifier, an output of the operational amplifier becomes unstable. However, since MN32 is turned ON at this time, a through current can be avoided in a circuit at a subsequent stage. In FIG. 19, sending a high signal to an internal circuit to stop the operational amplifier is controlled with this CTL signal.

Figure 20:
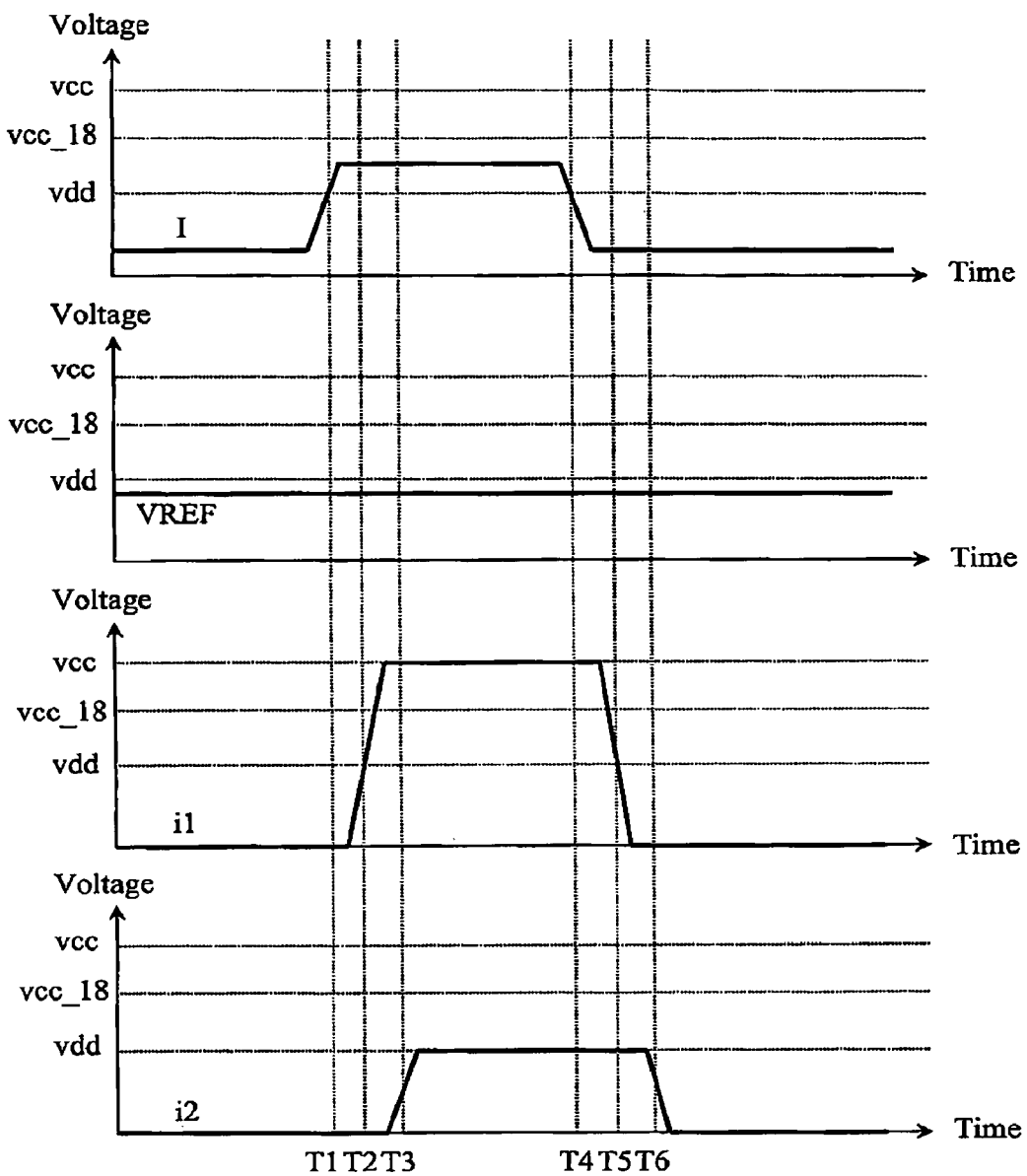
FIG. 20 is a waveform diagram showing the operation of the input circuit of FIG. 17.

FIG. 20 depicts operational waveforms of the circuit shown in FIG. 17. An input level of SSTL18 is not the signal with a full amplitude of 1.8 V but the signal with an amplitude of about 0.4 to 1 V centering on VREF. In this case, VREF is defined by specifications to be half the voltage of the vcc_18 power supply. First, a transition from a low level to a high level will be described. When an input is changed at a time T1 from a low level to a high level, the input signal crosses VREF at the time T1, and therefore, the output of the sense amplifier is changed. The sense amplifier then amplifies a difference between the input signal I and VREF and converts it to a signal with an amplitude of 0 V and vcc. It is assumed here that an input buffer receiving an output from the sense amplifier at the time T2 performs wave shaping. Then, the signal is converted by the level conversion circuit to a signal with an amplitude of vdd, and then makes a transition at a time T3 to a high level.

Next, a transition from a high level to a low level will be described. When the input is changed at a time T4 from a high level to a low level, the input signal crosses VREF at the time T4, and therefore, an output of the sense amplifier is changed. The sense amplifier then amplifies a difference between the input signal I and VREF and converts it to a signal with an amplitude of 0 V and vcc. It is assumed here that the input buffer receiving an output from the sense amplifier at the time T5 performs wave shaping. Then, the signal is converted by the level conversion circuit to a signal with an amplitude of vdd, and is then changed to 0 V at a time T6.

Figure 21:
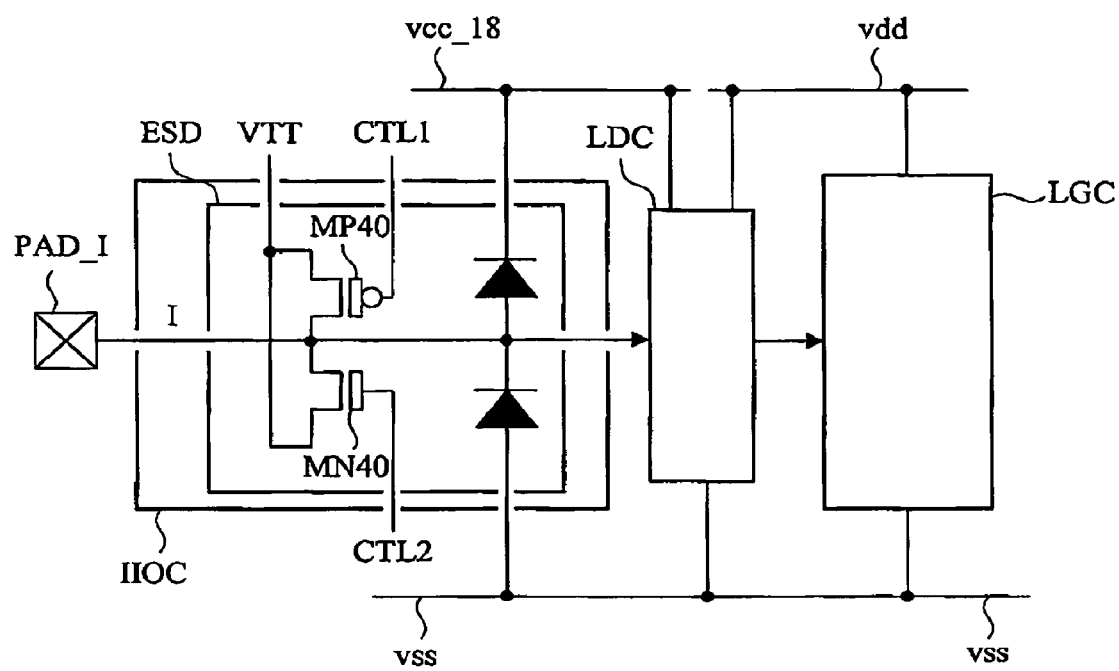
FIG. 21 is a block diagram showing a structure example of a terminating transistor of the input circuit in the semiconductor integrated circuit device according to one embodiment of the present invention.

FIG. 21 is a drawing that depicts one embodiment of a terminating resistor of the input circuit. In this case, the terminating resistor is formed of MP40 and MN40 in an ESD circuit. These MISFETs are placed between an input I and a VTT power supply. The VTT power supply is set to have a value of vcc_18/2 in SSTL, for example. Gate signals of these MISFETs are connected to CTL1 at the P type MISFET side and to CTL2 at the N type MISFET, respectively. CTL1 and CTL2 are formed by using MISFETs that can withstand the application of a vcc voltage, and these signals are driven at a vcc power supply voltage. When MN40 is formed to have a structure as described above, since MN40 can be used at a place where an ON resistance of the transistor is small, it is possible to achieve an area reduction effect. For example, when the terminating resistor is set to 50 Ω at the time of driving at 1.8 V, if it is assumed that the ON resistance of the MISFET is 2.5 KΩ per unit width (1 micrometer), a MISFET of 50 µm is required. By contrast, at the time of driving at 3.3 V, if it is assumed that the ON resistance of the MISFET is 1 KΩ per unit width, a MISFET required is of 20 µm. As described above, a size reduction of the MISFET can be achieved, and resulting area reduction can be achieved. Furthermore, since the control voltage of CTL1 and CTL2 is high, a sufficiently high gate voltage can be applied particularly in the case of controlling an N type MISFET. Therefore, since such an N type MISFET can be operated in a sufficient saturation area, it is possible to sufficiently reduce an influence of slight fluctuations of the control voltage on variations in ON resistance.

Note that the P type MISFETs can be omitted in this case, and the terminating resistor can be formed of only N type MISFETs.

In the present embodiment, description has been made mainly to SSTL. However, the present embodiment can be applied to a terminating transistor of a general low-amplitude I/O.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to a semiconductor device such as a system LSI or a microprocessor for mobile devices.

What is claimed is:

1. A semiconductor integrated circuit device comprising:
a first circuit that outputs a first signal which varies between a ground voltage and a second voltage higher than the ground voltage;
a first conversion circuit that receives the first signal and that outputs a second signal which varies between the ground voltage and a third voltage higher than the second voltage;
a first output circuit that receives the second signal and that outputs a third signal which varies between the ground voltage and a fourth voltage between the second voltage and third voltage;
a second circuit that outputs a fourth signal which varies between the ground voltage and the second voltage;
a second conversion circuit that receives the fourth signal and that outputs a fifth signal which varies between the ground voltage and the third voltage; and
a second output circuit that receives the fifth signal and that outputs a sixth signal which varies between the ground voltage and a fifth voltage between the second voltage and fourth voltage,
wherein the first and second circuits are supplied with the ground voltage and the second voltage,
wherein the first and second conversion circuits are supplied with the ground voltage and the third voltage,
wherein the first output circuit is supplied with the ground voltage and the fourth voltage, and
wherein the second output circuit is supplied with the ground voltage and the fifth voltage.

2. The semiconductor integrated circuit device according to claim 1,
wherein each said first and second circuits includes a first field-effect transistor that is supplied with the ground voltage and the second voltage, and
wherein each said first and second conversion circuits and each said first and second output circuits include a second field-effect transistor having a gate insulating film thicker than a gate insulating film of said first field effect transistor and that is supplied with the third voltage.

3. A semiconductor integrated circuit device comprising:
a first circuit that outputs a first signal which varies between a ground voltage and a second voltage higher than the ground voltage;
a first conversion circuit that receives the first signal and that outputs a second signal which varies between the ground voltage and a third voltage higher than the second voltage;
a first output circuit that receives the second signal and that outputs a third signal which varies between the ground voltage and a fourth voltage between the second voltage and third voltage;
a second circuit that outputs a fourth signal which varies between the ground voltage and the second voltage;
a second conversion circuit that receives the fourth signal and that outputs a fifth signal which varies between the ground voltage and the third voltage; and
a second output circuit that receives the fifth signal and that outputs a sixth signal which varies between the ground voltage and the third voltage,
wherein the first and second circuits are supplied with the ground voltage and the second voltage,
wherein the first and second conversion circuits and the second output circuit are supplied with the ground voltage and the third voltage, and
wherein the first output circuit is supplied with the ground voltage and the fourth voltage.

4. The semiconductor integrated circuit device according to claim 3, wherein each said first and second circuits include a first field-effect transistor that is supplied with the second voltage, and
wherein each said first and second conversion circuits and each said first and second output circuits include a second field-effect transistor having a gate insulating film thicker than a gate insulating film of said first field effect transistor and supplied with the third voltage.

* * * * *

UNITED STATES PATENT AND TRADEMARK OFFICE
CERTIFICATE OF CORRECTION

| | | |
|---|---|---|
| PATENT NO. | : 8,013,656 B2 | |
| APPLICATION NO. | : 12/944898 | |
| DATED | : September 6, 2011 | |
| INVENTOR(S) | : Yusuke Kanno et al. | |

It is certified that error appears in the above-identified patent and that said Letters Patent is hereby corrected as shown below:

On the Title Page:

In Item (75), the first inventor's given name should read --Yusuke--.

Signed and Sealed this
Twelfth Day of February, 2013

Teresa Stanek Rea
*Acting Director of the United States Patent and Trademark Office*